(12) United States Patent
Kanzaki

(10) Patent No.: US 8,274,791 B2
(45) Date of Patent: Sep. 25, 2012

(54) RESIN-SEALED ELECTRONIC CONTROL DEVICE AND METHOD OF FABRICATING THE SAME

(75) Inventor: Shozo Kanzaki, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 229 days.

(21) Appl. No.: 12/874,903

(22) Filed: Sep. 2, 2010

(65) Prior Publication Data
US 2011/0205701 A1  Aug. 25, 2011

(30) Foreign Application Priority Data
Feb. 22, 2010  (JP) ................. 2010-036399

(51) Int. Cl.
*H05K 7/20* (2006.01)
(52) U.S. Cl. ........ 361/699; 361/689; 361/704; 257/706; 257/707; 257/714; 165/80.4; 165/104.33
(58) Field of Classification Search .......... None
See application file for complete search history.

(56) References Cited

U.S. PATENT DOCUMENTS

| | | | |
|---|---|---|---|
| 6,765,285 B2 * | 7/2004 | Shinohara et al. | 257/678 |
| 7,304,379 B2 * | 12/2007 | Andou | 257/714 |
| 7,547,966 B2 * | 6/2009 | Funakoshi et al. | 257/707 |
| 7,772,709 B2 * | 8/2010 | Ueda et al. | 257/787 |
| 7,848,104 B2 * | 12/2010 | Shinohara | 361/695 |
| 8,027,161 B2 * | 9/2011 | Ishiyama | 361/699 |
| 2004/0212965 A1 | 10/2004 | Ishii et al. | |

FOREIGN PATENT DOCUMENTS

| | | |
|---|---|---|
| DE | 29513950 U1 | 1/1997 |
| DE | 19646195 A1 | 5/1998 |
| DE | 102005048100 A1 | 4/2007 |
| DE | 102008054306 A1 | 12/2009 |
| EP | 0 308 986 A1 | 4/1989 |
| JP | 58-012955 U | 1/1983 |
| JP | 04-196161 A | 7/1992 |
| JP | 2003-289124 A | 10/2003 |
| JP | 2004-281722 A | 10/2004 |
| JP | 2006-135361 A | 5/2006 |

* cited by examiner

*Primary Examiner* — Boris Chervinsky
(74) *Attorney, Agent, or Firm* — Sughrue Mion, PLLC

(57) ABSTRACT

Provided is a resin-sealed electronic control device reduced in size, which includes a double-sided mounting board as at least one of a plurality of electronic boards obtained by division so that a large mounting surface with a small plane area is ensured. Each of a first electronic board (30A) and a second electronic board (40A) bonded onto an upper surface and a lower surface of each of a pair of separate beam members (20A) includes two surfaces on which outer circuit components (31, 32, 41, 42) and an inner circuit component (33, 43) are respectively mounted. A height of each of the inner circuit components is equal to or less than a thickness of each of the separate beam members (20A). Heat-generating components (32, 42) in the outer circuit components are provided to be adjacent to and opposed to the separate beam members (20A).

13 Claims, 16 Drawing Sheets

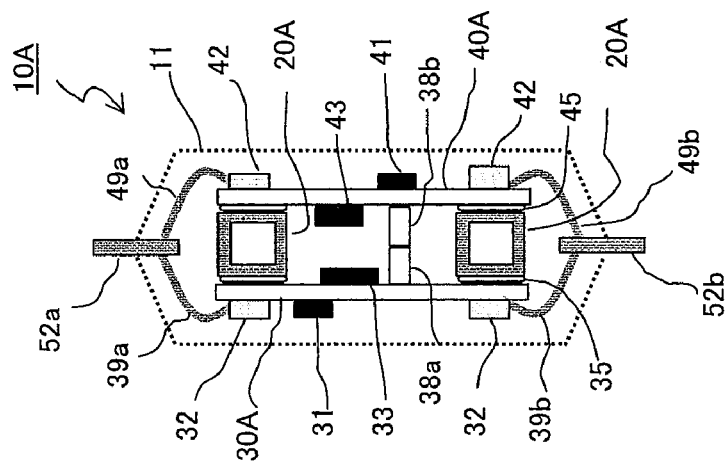
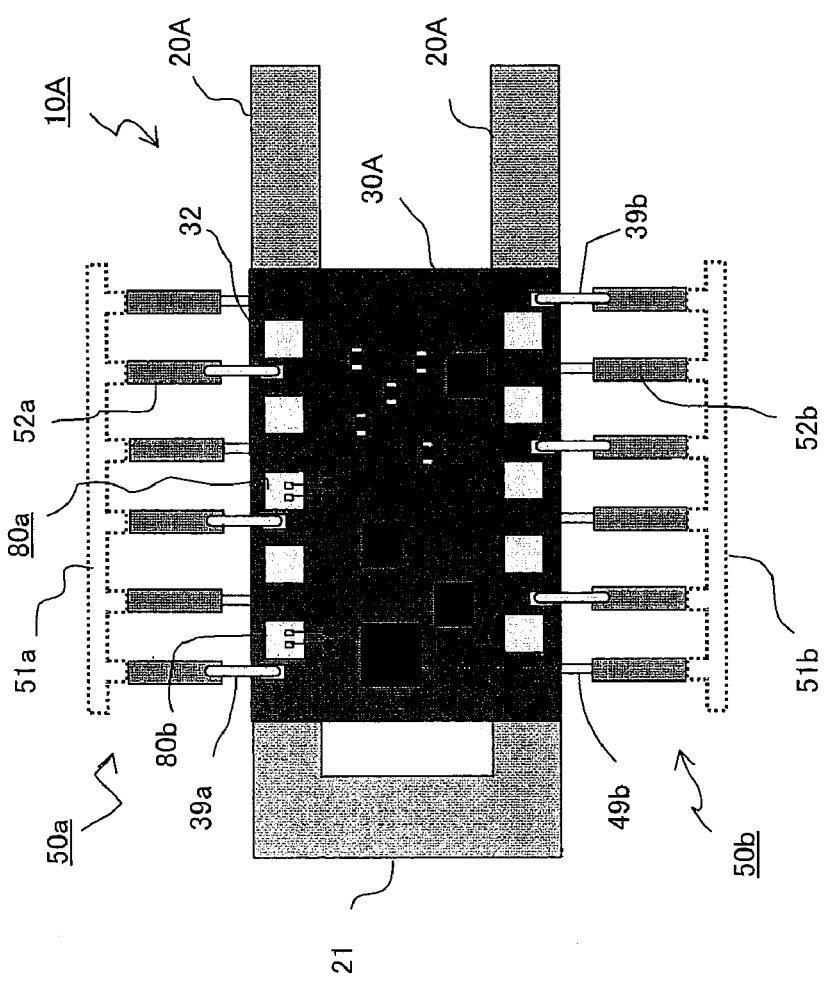

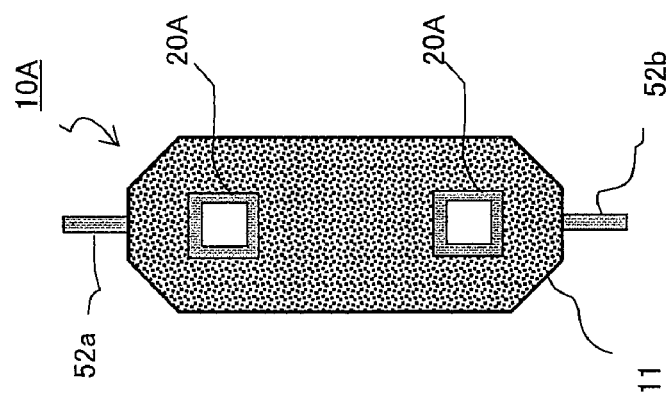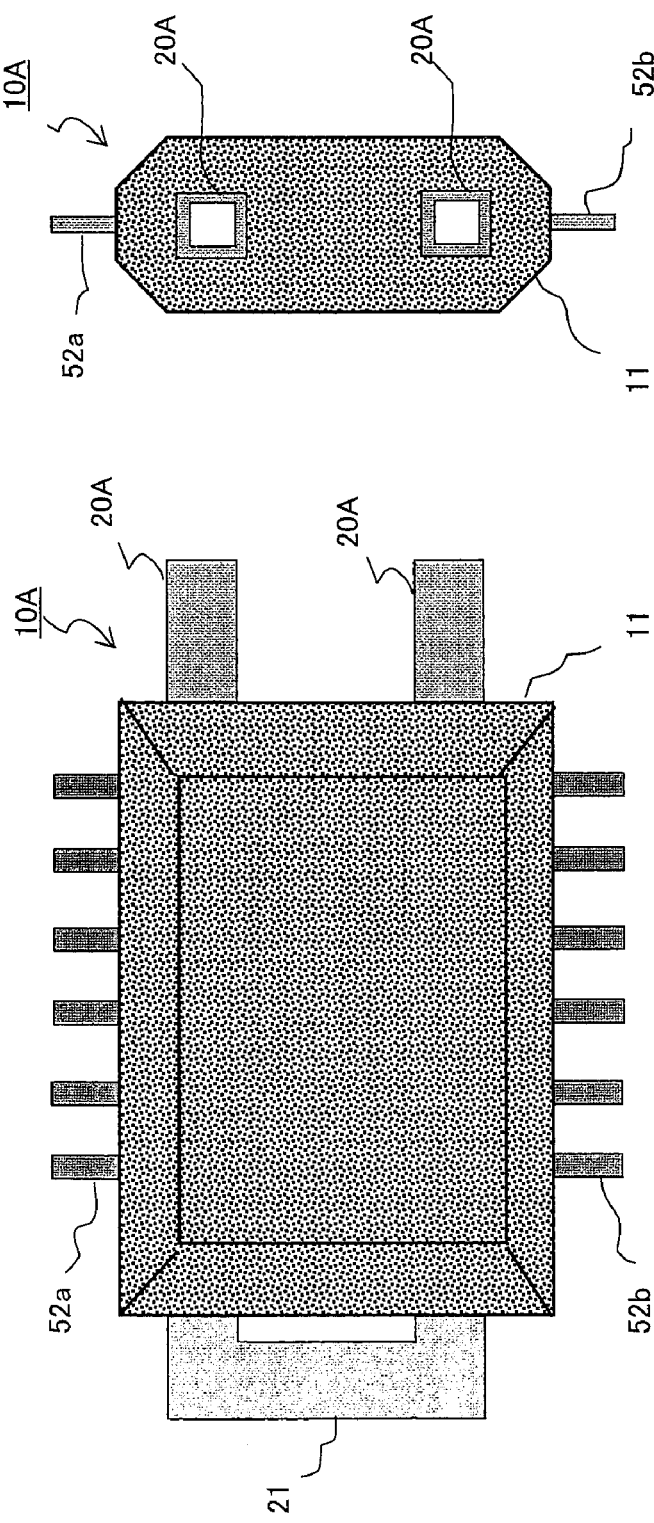

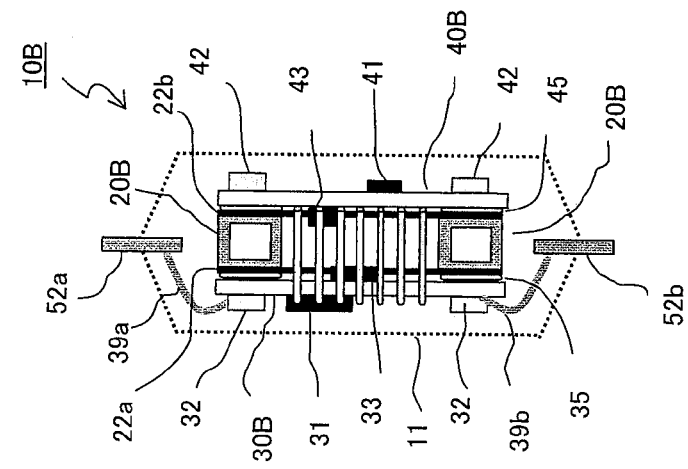
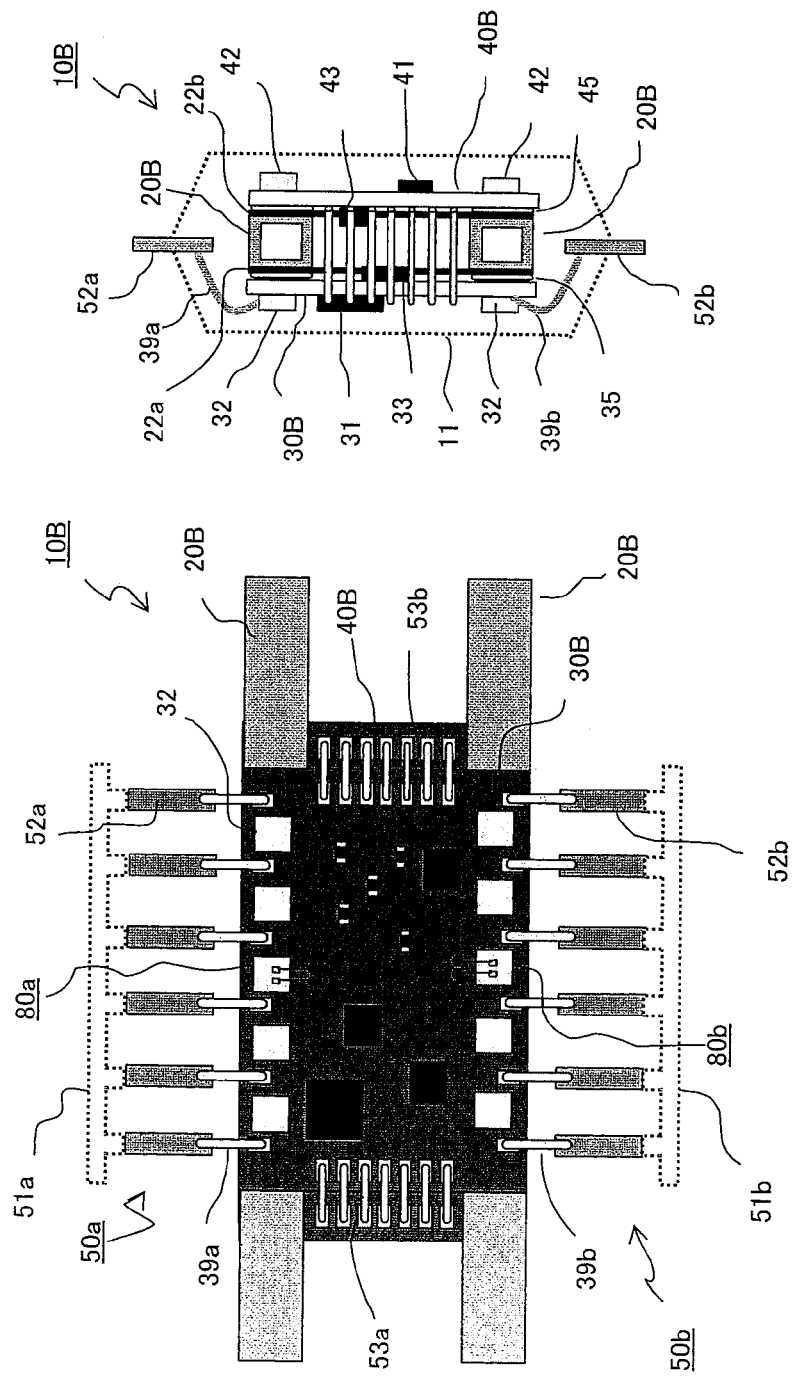
FIG. 8A
FIG. 8B

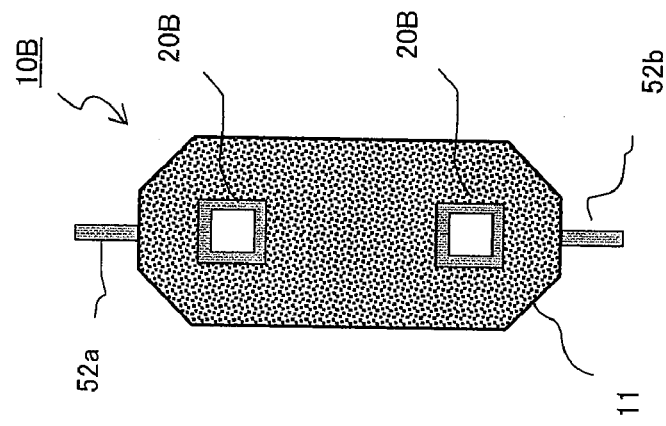
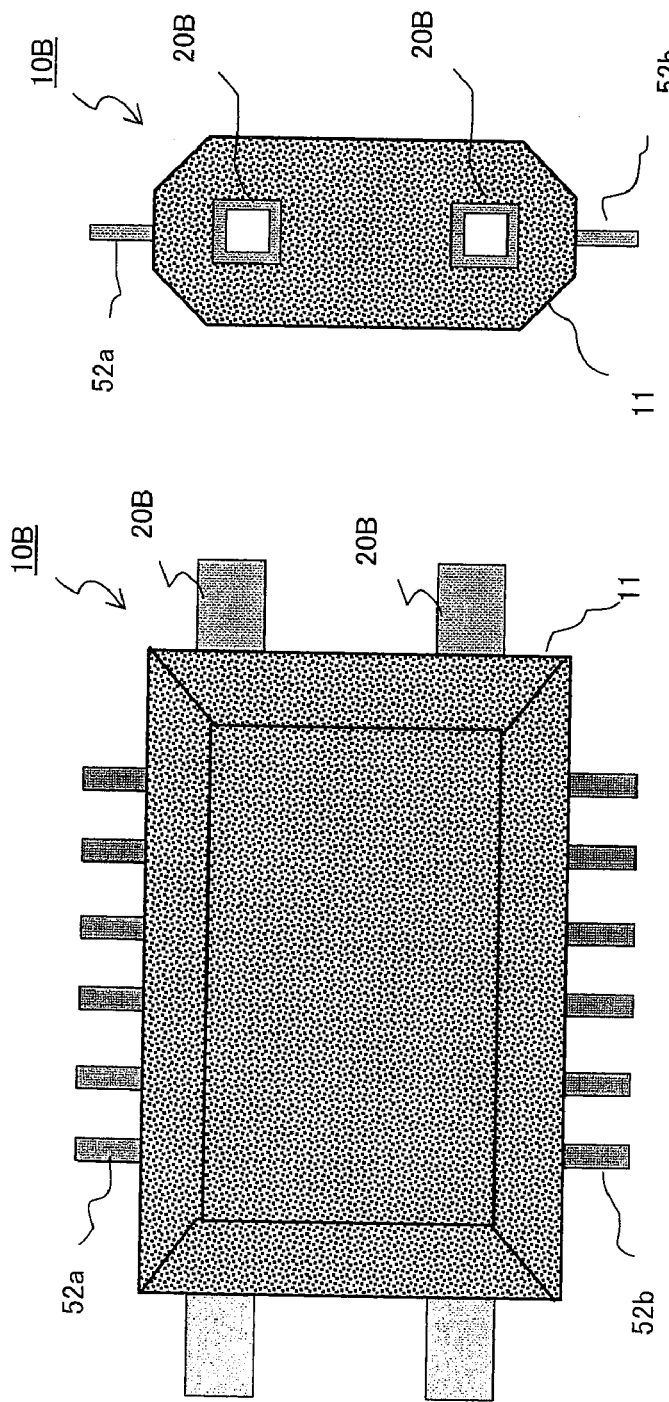

RESIN-SEALED ELECTRONIC CONTROL DEVICE AND METHOD OF FABRICATING THE SAME

BACKGROUND OF THE INVENTION

1. Field of the Invention

The present invention relates to a resin-sealed electronic control device used as an on-vehicle electronic control device, and a method of fabricating the same.

2. Description of the Related Art

As a control device for an automobile transmission, an integrated electronic control device mounted inside the transmission is widely put into practical use.

The on-vehicle electronic control device as described above includes any one of a ceramic board and a polyimide board bonded to a support member serving as a thermal diffuser plate. The entire on-vehicle electronic control device except for a part of external connection terminals and a part of the support member is integrally formed with a thermosetting resin.

For example, the invention entitled "Electronic Circuit Apparatus and Method of Manufacturing the Same", which is described in Japanese Patent Application Laid-open No. 2004-281722 (FIG. 1 and Abstract), discloses a resin-sealed electronic circuit apparatus with a high heat-dissipating property and a high packaging density in applications where high hermetic-sealing property and durability are required. In the electronic circuit apparatus, at least two wiring boards, on which electronic components are mounted, are fixedly bonded to a highly thermally conductive thermal diffuser plate through an intermediation of an adhesive. The entire wiring boards, the entire thermal diffuser plate, and a part of an external connection terminal are hermetically sealed by and integrally molded with a thermosetting resin composition. In this manner, the small and highly reliable electronic circuit apparatus can be provided at low cost.

Specifically, the aforementioned electronic circuit apparatus includes: a multilayered wiring board on which at least two electronic components are mounted; a polyimide wiring board on which heating elements are mounted; and the thermal diffuser plate having a higher thermal conductivity than those of the multilayered wiring board and the polyimide wiring board; and an external connection terminal.

The electronic circuit apparatus is a control unit for an automobile, which has the following structure. The multilayered wiring board is fixedly bonded to one surface of the thermal diffuser plate through an intermediation of the adhesive, whereas the polyimide wiring board is fixedly bonded to the other surface of the thermal diffuser plate through an intermediation of an adhesive. The polyimide wiring board is bent to be fixedly bonded so that an upper surface and a lower surface of the thermal diffuser plate are connected to each other. In this manner, the polyimide wiring board and the multilayered wiring board are electrically connected to each other. The multilayered wiring board, the polyimide wiring board, and the external terminal are electrically connected to each other. The entire surface of the multilayered wiring board, the entire surface of the polyimide wiring board, a part of the thermal diffuser plate, and a part of the external connection terminal are integrally molded with the thermosetting resin composition. The multilayered wiring board and the polyimide wiring board, and the external terminal are connected to each other by a bonding wire.

Moreover, the invention entitled "Electronic Circuit Device and Method of Manufacturing the Same", which is described in Japanese Patent Application Laid-open No. 2006-135361 (FIG. 1 and Abstract), discloses the following electronic circuit device. In the electronic circuit device, wiring boards on which at least two electronic components are mounted are fixedly bonded to a thermal diffuser plate having a higher heat conductivity than that of the wiring boards. In addition, an external connection terminal and the wiring boards are electrically connected to each other. The entire surfaces of the wiring boards, a part of the thermal diffuser plate, and a part of the external connection terminal are integrally molded with a thermosetting resin composition. In an outer layer of the electronic circuit device, a part of a flow path, through which a cooling medium can circulate, is provided.

According to the electronic circuit device described above, by fixedly bonding the electronic circuit boards respectively onto an upper surface and a lower surface of the thermal diffuser plate having a high heat-radiating property, a mounting process is simplified to reduce cost while the heat-radiating property and a mounting density can be improved. In addition, the entire electronic circuit device is integrally molded with the thermosetting resin composition. Thus, an assembly process can be simplified. Further, the electronic circuit device having a high hermetic-sealing property and high reliability even when used in a severe environment can be provided.

In the electronic circuit apparatus described in Japanese Patent Application Laid-open No. 2004-281722 cited above, the wiring board is divided into two pieces so as to be fixedly bonded onto the two surfaces of the thermal diffuser plate. As a result, an area of the wiring board is halved, while the heat-dissipating property is improved. The polyimide wiring board (flexible board) is used as one of the wiring boards so that the polyimide wiring board is bent to be connected to the ceramic board which is the other board.

However, each of the wiring boards is a one-sided board for bonding to the thermal diffuser plate. Therefore, in order to ensure an area on which the circuit components are mounted, the area of each of the wiring boards is disadvantageously increased.

Moreover, if the area of each of the wiring boards is large, there is another problem in that the wiring board is likely to be separated from a molded exterior covering material with repeating changes in temperature due to a difference in linear expansion coefficient.

Further, if the heat-generating circuit components are provided on both the upper surface and the lower surface of the thermal diffuser plate, there is a further problem in that the temperature increases in a locally concentrated manner.

Even in the electronic circuit device described in Japanese Patent Application Laid-open No. 2006-135361 cited above, each of the two wiring boards is a one-sided mounting board. Therefore, there is a problem in that an area of each of the wiring boards is increased. In addition, a complex cooling-medium flow path for cooling the entire surfaces of the wiring boards is required. Thus, there is another problem in that a specific one of the heat-generating components cannot be cooled in a focused way.

SUMMARY OF THE INVENTION

The present invention has been made to solve the problems described above, and therefore, it is an object of the present invention to provide a low-cost small resin-sealed electronic control device in which at least one of two electronic boards serving as wiring boards bonded to two surfaces of a support member is a double-sided mounting board so as to increase an area on which circuit components are mounted, and a method of fabricating the same.

It is another object of the present invention to provide a low-cost small resin-sealed electronic control device in which the electronic boards including the double-sided mounting board are configured to perform one of thermal diffusion and heat dissipation through an intermediation of the separate beam members serving as the support member and a method of fabricating the same.

A resin-sealed electronic control device according to the present invention includes: a first electronic board and a second electronic board, to each of which a plurality of external connection terminals are connected, each of the first electronic board and the second electronic board carrying a plurality of circuit components mounted thereon; a thermally conductive support member including an upper surface and a lower surface, on which the first electronic board and the second electronic board are respectively bonded to be fixed; and a synthetic resin serving as an exterior covering material for integrally molding the entire first electronic board, the entire second electronic board, a portion of each of the plurality of external connection terminals, and a portion of the support member, in which: the support member is formed of a pair of thermally conductive separate beam members for retaining the first electronic board and the second electronic board at a distance from each other; a pair of opposite side end portions of the first electronic board and a pair of opposite side end portions of the second electronic board opposed to each other, the pair of opposite side end portions of the first electronic board being bonded to be fixed onto one of upper surfaces and lower surfaces of the pair of separate beam members with an adhesive, the pair of opposite side end portions of the second electronic board being bonded to be fixed onto another of the upper surfaces and the lower surfaces of the pair of separate beam members with an adhesive; at least one of the first electronic board and the second electronic board is a double-sided board including an inner surface on which an inner circuit component is mounted and an outer surface on which outer circuit components are mounted, the outer circuit components including heat-generating components being mounted on an outer surface of at least one of the first electronic board and the second electronic board; the heat-generating components are adjacent to and opposed to the pair of separate beam members with the adhesives interposed therebetween; the inner circuit component is arranged between the pair of separate beam members and has a smaller height size than a distance between the first electronic board and the second electronic board opposed to each other; and the exterior covering material fills a narrow space surrounded by the first electronic board, the second electronic board, and the pair of separate beam members.

Further, a method of fabricating the resin-sealed electronic control device according to the present invention includes: connecting the first electronic board and the second electronic board to each other; connecting the plurality of external connection terminals to the first electronic board and the second electronic board; and molding the exterior covering material by injecting the heated and melted synthetic resin under pressure between dies along a longitudinal direction of the pair of separate beam members after heating and curing the adhesives.

According to the resin-sealed electronic control device of the present invention, the separate beam members serve as the support member and a thermal diffuser member at the same time. In addition, the separate beam members ensure the distance between the first electronic board and the second electronic board to enable the mounting on two surfaces of each of the electronic boards. The circuit components mounted on the two surfaces of each of the electronic boards are arranged between the separate beam members. As a result, a mounting area is increased without increasing a plane area of each of the electronic boards. As a result, the present invention has the effects of reducing a plane area and a volume of the entire product.

Moreover, the heat-generating components mounted on the electronic boards are adjacent to and opposed to the separate beam members with the adhesives interposed therebetween and have the effects of preventing the temperature from being locally and extremely increased by thermal diffusion.

Moreover, a space between the first electronic board and the second electronic board is filled with the exterior covering material to provide a non-hollow structure. As a result, the electronic boards can be prevented from being deformed at the time of pressure-molding of the synthetic resin. Moreover, the effects of preventing the separation of a solder of the mounted circuit components and the separation between the electronic boards and the support member or the exterior covering material due to expansion and shrinkage of the air with a change in environmental temperature during actual use.

According to the method of fabricating the resin-sealed electronic control apparatus of the present invention, the synthetic resin which is heated and melted is injected under pressure between the dies along the longitudinal direction of the separate beam members so as to mold the exterior covering material after the connection between the first electronic board and the second electronic board, the connection of the external connection terminals to the electronic boards, and the heating and curing of the adhesives. Therefore, the adhesives which bond the first and second electronic boards and the support member to each other are not melted and softened by the heat of the melted synthetic resin at the time of pressure-molding, and hence the first electronic board, the second electronic board, and the components are reliably integrated with each other.

BRIEF DESCRIPTION OF THE DRAWINGS

In the accompanying drawings:

FIG. 1A is a top view of a resin-sealed electronic control device according to a first embodiment of the present invention, and FIG. 1B is a right side view of FIG. 1A;

FIG. 2A is another top view of the electronic control device according to the first embodiment of the present invention, and FIG. 2B is a right side view of FIG. 2A;

FIG. 8A is a top view of an electronic control device according to a second embodiment of the present invention before sealing with a resin, and FIG. 8B is a right side view of FIG. 8A;

FIG. 9A is a top view of the electronic control device according to the second embodiment of the present invention, and FIG. 9B is a right side view of FIG. 9A;

DETAILED DESCRIPTION OF THE PREFERRED EMBODIMENTS

Figure 4:
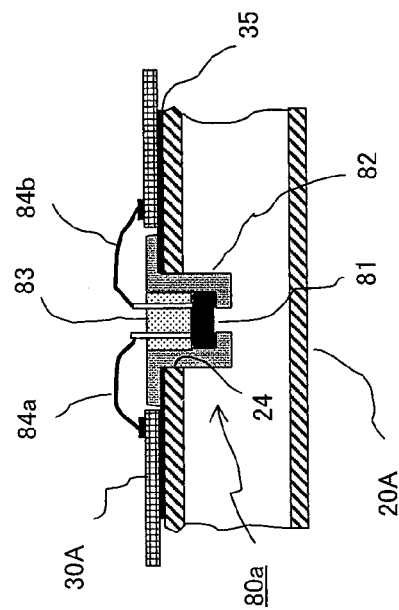
FIG. 4 is a sectional view illustrating a state where the cooling-medium sensor 80*a* is mounted.

Hereinafter, a resin-sealed electronic control device according to each embodiment of the present invention is described with reference to the drawings. In each of the drawings, the same or equivalent members and portions are denoted by the same reference numerals for description.

First Embodiment

FIG. 1A is a top view of a resin-sealed electronic control device (hereinafter, abbreviated as "electronic control device") according to a first embodiment of the present invention, and FIG. 1B is a right side view of FIG. 1A. FIG. 2A is another top view of the electronic control device according to the first embodiment of the present invention, and FIG. 2B is a right side view of FIG. 2A.

An electronic control device 10A, which is a transmission control device for an automobile transmission, includes: a pair of separate beam members 20A; a first electronic board 30A; a second electronic board 40A; a plurality of external connection terminals 52a and 52b; and an exterior covering material 11. The separate beam members 20A serve as hollow cylindrical thermally-conductive support members made of, for example, a copper alloy. One end of one of the separate beam members 20A is connected to one end of the other separate beam member 20A through a connection portion 21. The first electronic board 30A is bonded to be fixed to upper surfaces of the respective separate beam members 20A, whereas the second electronic board 40A is bonded to be fixed to lower surfaces of the respective separate beam members 20A. The plurality of external connection terminals 52a are provided on one side of the first electronic board 30A and the second electronic board 40A, whereas the plurality of external connection terminals 52b are provided on the side of the first electronic board 30A and the second electronic board 40A, which is opposite to the side on which the external connection terminals 52a are provided. Both of the entire first electronic board 30A and the entire second electronic board 40A, a part of each of the separate beam members 20A, and a part of each of the external connection terminals 52a and 52b are covered with the exterior covering material 11 which is a thermosetting resin.

Each of the separate beam members 20A serving as the support members has a hollow cylindrical shape. In the hollow, hydraulic working oil serving as a cooling medium (not shown) resides and flows.

For example, outer circuit components 31 and 32 are mounted on one surface of the first electronic board 30A formed of, for example, a glass epoxy board, whereas an inner circuit component 33 is mounted on the other surface of the first electronic board 30A. The outer circuit components 31 and 32 are located outside the pair of separate beam members 20A opposed to each other, whereas the inner circuit component 33 is located inside the pair of separate beam members 20A. The outer circuit components 31 and 32 include heat-generating components 32.

Opposite side end portions (two lateral edge portions), which are a pair of side edge portions of the first electronic board 30A, are bonded to be fixed to one surfaces of the respective separate beam members 20A through an intermediation of an adhesive 35 which is, for example, a thermosetting silicon resin composition. The heat-generating components 32 are mounted on the opposite side end portions of the first electronic board 30A, and are adjacent to and opposed to each of the separate beam members 20A with the first electronic board 30A interposed therebetween.

The inner circuit components 33 are arranged between the pair of separate beam members 20A. A height size of the inner circuit component 33 is smaller than a thickness size of each of the separate beam members 20A so that the inner circuit component 33 does not abut against at least the second electronic board 40A.

For example, on two surfaces of the second electronic board 40A formed of a glass epoxy board as in the case of the first electronic board 30A, outer circuit components 41 and 42 and inner circuit component 43 are respectively mounted. The outer circuit components 41 and 42 include heat-generating components 42.

Opposite side end portions of the second electronic board 40A are bonded to be fixed to a surface of each of the separate beam members 20A, which is opposite to the surface which is bonded to be fixed to the first electronic board 30A, through an intermediation of an adhesive 45 which is, for example, a thermosetting silicon resin composition. The heat-generating components 42 are mounted on the opposite side end portions of the second electronic board 40A, and are adjacent to and opposed to each of the separate beam members 20A with the second electronic board 40A interposed therebetween.

The inner circuit component 43 is arranged between the pair of separate beam members 20A. A height size of the inner circuit component 43 is smaller than a thickness size of each of the separate beam members 20A so that the inner circuit component 43 does not abut against at least the first electronic board 30A.

A board-to-board connector 38a is mounted on the inner surface of the first electronic board 30A, whereas a board-to-board connector 38b is mounted on the inner surface of the second electronic board 40A. The board-to-board connectors 38a and 38b are brought into abutment against each other so as to be connected to each other.

The plurality of external connection terminals 52a and the plurality of external connection terminals 52b are connected to connection lands of the first electronic board 30A and the second electronic board 40A through an intermediation of bonding wires 39a, 39b, 49a, and 49b which are, for example, thin aluminum wires.

The plurality of external connection terminals 52a initially constitute a terminal-group plate 50a, while the plurality of external connection terminals 52b initially constitute a terminal-group plate 50b. At this time, in the terminal-group plate 50a, the plurality of external connection terminals 52a are connected to each other through a cutout connection portion 51a. In the same manner, in the terminal-group plate 50b, the plurality of external connection terminals 52b are connected to each other through a cutout connection portion 51b. In the final step of assembly, by cutting out the cutout connection portions 51a and 51b, the plurality of external connection terminals 52a and 52b are separated into individual pieces.

A cooling-medium sensor 80a is mounted to one of the separate beam members 20A. A structure in which the cooling-medium sensor 80a is mounted is described below referring to FIG. 4.

A structure in which the heat-generating components 32 and 42 are mounted is described below referring to FIG. 5.

Figure 3:
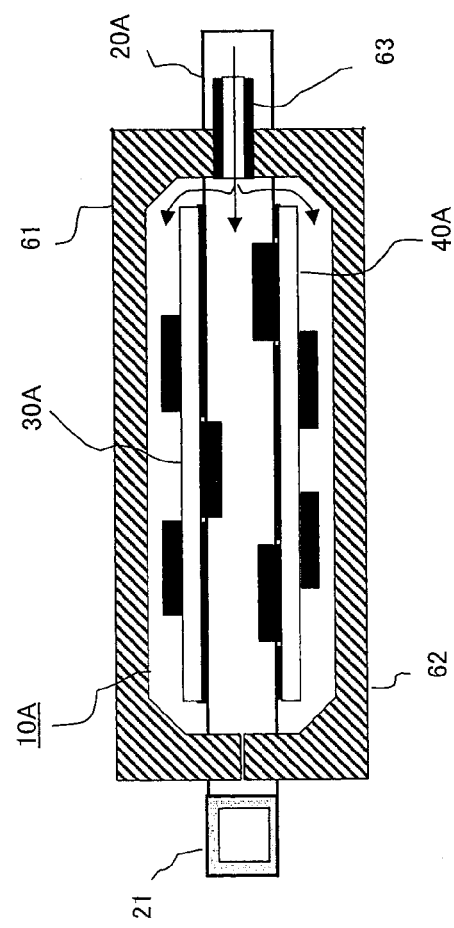
FIG. 3 is a sectional view illustrating an upper die and a lower die used for the electronic control device.

FIG. 3 is a sectional view illustrating an upper die 61 and a lower die 62 used for the electronic control device 10A.

The dies 61 and 62 are integrated through temporary fixtures (not shown) provided inside the dies 61 and 62. Inside the dies 61 and 62, the electronic control device 10A before molding, in which the external connection terminals 52a and 52b are connected to each other, is placed.

A resin injection port 63 passes from the right to the left on the paper plane of FIG. 3. Through the resin injection port 63, a synthetic resin serving as a thermosetting or thermoplastic resin which is heated and melted is injected under pressure into a space closed by the upper die 61 and the lower die 62.

After the injection of the synthetic resin from the resin injection port 63 under pressure, a flow of the synthetic resin is split into a stream flowing into a space above the first electronic board 30A, a stream flowing into an internal space surrounded by the first electronic board 30A, the second electronic board 40A, and the pair of separate beam members 20A, and a stream flowing into a space below the second electronic board 40A, as indicated by the arrows of FIG. 3. Then, the streams join together in a space on the side opposite to the resin injection port 63.

The thermosetting resin has a property of not being softened and melted by re-heating once cured after heating and melting. The gel adhesives 35 and 45 including the thermosetting resin composition are cured after the bonding of the first electronic board 30A and the second electronic board 40A to the pair of separate beam members 20A. As a result, the adhesives 35 and 45 are not softened when the exterior covering material 11 is molded through heating.

When the thermoplastic resin is used for the external covering member 11, the thermoplastic resin is melted by re-heating. Therefore, the components inside the external covering member 11 can be collected separately.

FIG. 4 is a sectional view illustrating a state where the cooling-medium sensor 80a is mounted. A small window 24 serving as an opening portion is formed through a wall surface of one of the separate beam members 20A. In the small window 24, a housing 82 bonded to the one of the separate beam members 20A with the adhesive 35 is provided. Inside the housing 82, a sensor element 81 serving as a component of the cooling-medium sensor 80a is hermetically sealed by a filler 83. The sensor element 81 is connected to the first electronic board 30A or the second electronic board 40A through an intermediation of connection wires 84a and 84b.

The sensor element 81 is for measuring a temperature of the hydraulic working oil which serves as the cooling medium by using, for example, a thermister which is a temperature-sensitive variable resistance element.

Although the cooling-medium sensor 80a is a temperature sensor using the temperature-sensitive variable resistance element in this embodiment, the cooling-medium sensor 80a may also be a pressure sensor for measuring a pressure of the cooling medium by using a piezoelectric sensor which is a pressure-sensitive heat-generating element.

Moreover, as illustrated in FIG. 1, in an area of the first electronic board 30A, which is adjacent to and opposed to one of the separate beam members 20A, a thermister can be mounted as a simplified cooling-medium sensor 80b. In this case, an approximate temperature of the hydraulic working oil can be indirectly detected without direct contact with the hydraulic working oil serving as the cooling medium.

Figure 5:
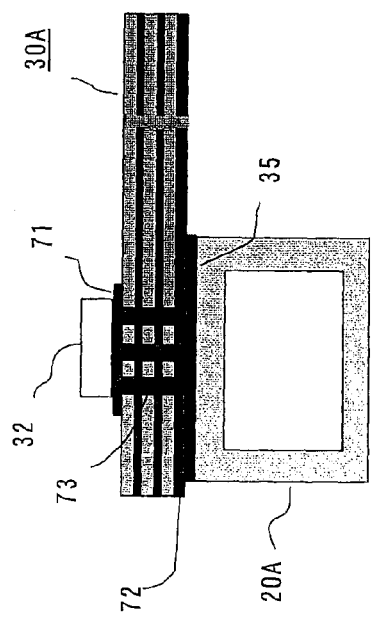
FIG. 5 is a sectional view illustrating a state where the heat-generating components are mounted.

FIG. 5 is a sectional view illustrating a state where the heat-generating components 32 are mounted. The heat-generating components 32 are mounted on an outer-surface pattern 71 of the first electronic board 30A. The outer-surface pattern 71 and an inner-surface pattern 72 are thermally connected to each other through a plurality of plated through-holes 73 provided for heat transmission.

The inner-surface pattern 72 is adjacent to and opposed to one of the surfaces of each of the separate beam members 20A with the thermally conductive adhesive 35 interposed therebetween.

Small holes may be formed in the first electronic board 30A so that projections integrally formed with the separate beam members 20A are fitted into the small holes. Then, heat-generating electrodes of the heat-generating components 32 are caused to be opposed to the projections. A gap formed between the heat-generating elements and the projections which are opposed to each other is filled with a thermally conductive adhesive for heat transmission.

Even in the case of the heat-generating components 42 mounted on the second electronic board 40A, the same structure as that of the heat-generating components 32 mounted on the first electronic board 30A is used. As in the case of the heat from the heat-generating components 32, the heat from the heat-generating components 42 is transmitted to the other surface of each of the separate beam members 20A through the outer-surface pattern 71, the plated through-holes 73, and the inner-surface pattern 72.

Figure 6B:
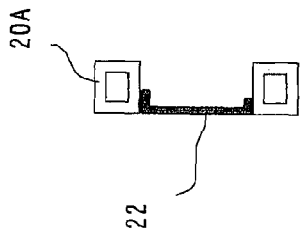
FIG. 6B is a right side view of FIG. 6A.
Figure 6A:
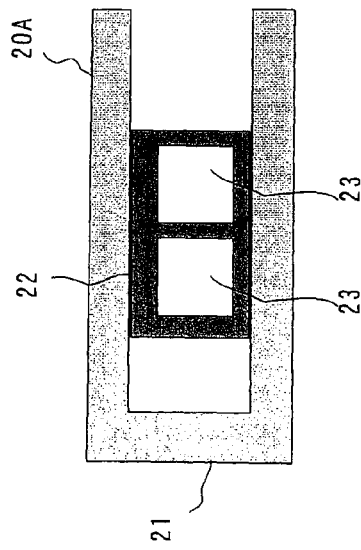
FIG. 6A is a top view illustrating an example where a connection plate is provided between the pair of separate beam members of the electronic control device according to the first embodiment.

FIG. 6A is a top view illustrating an example where a connection plate 22 is provided between the pair of separate beam members 20A of the electronic control device 10A according to the first embodiment, and FIG. 6B is a right side view of FIG. 6A.

The highly thermally conductive connection plate 22 is integrated with the pair of separate beam members 20A by welding, brazing, or bonding so that the pair of separate beam members 20A are thermally connected to each other.

The connection plate 22 has a plurality of window holes 23 formed therein. Through the window holes 23, the inner circuit components 33 and 43 are mounted on the first electronic board 30A and the second electronic board 40A.

The number of the window holes 23 may be one.

Figure 7A:
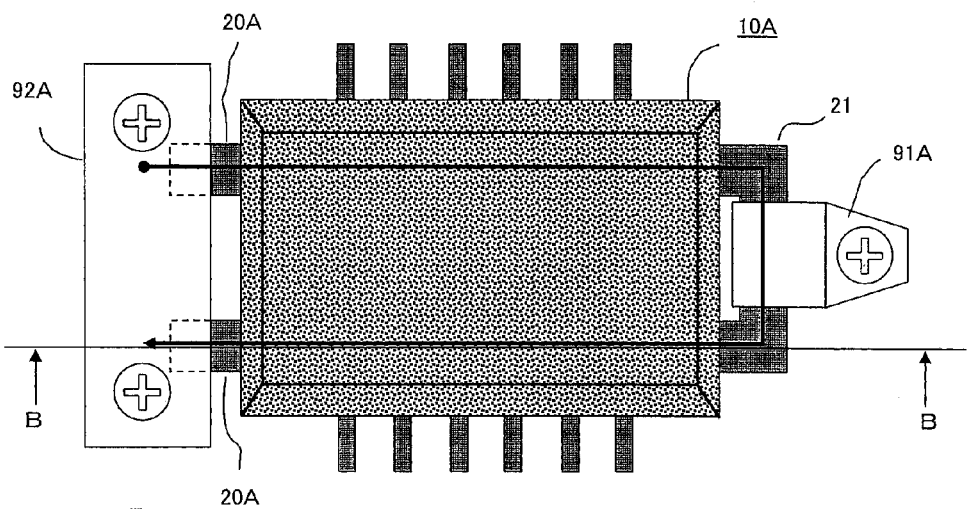
FIG. 7A is a view illustrating a state where the electronic control device is mounted, which is a perspective top view with a cover 96A removed.
Figure 7B:
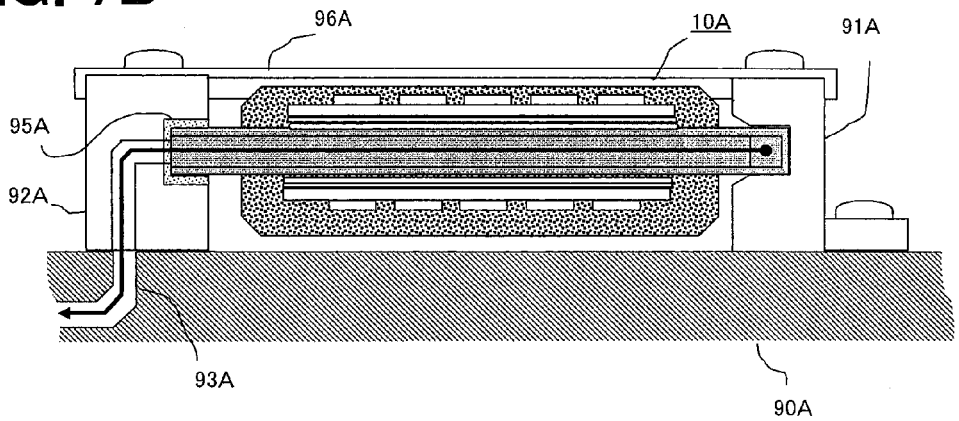
FIG. 7B is a sectional view taken along the line B-B of FIG. 7A.

FIG. 7A is a view illustrating a state where the electronic control device 10A is mounted, which is a perspective top view with a cover 96A removed, and FIG. 7B is a sectional view taken along the line B-B of FIG. 7A.

The electronic control device 10A is fixed to a mounting surface 90A of a gear box of the automobile transmission through an intermediation of a mounting foot 91A and a feed and discharge fixing base 92A.

The mounting foot 91A secures the externally exposed connection portion 21.

The feed and discharge fixing base 92A fixes an externally exposed open end of each of the separate beam members 20A through an intermediation of a packing 95A.

An inlet pipe (not shown) for the hydraulic working oil serving as the cooling medium is connected to the upper open end which is illustrated in the upper part of FIG. 7A, whereas an outlet pipe 93A for the hydraulic working oil is connected to the other open end.

The hydraulic working oil is introduced from the inlet pipe to pass through one of the separate beam members 20A, the connection portion 21, and the other separate beam member 20A so as to be externally discharged through the outlet pipe 93A. Then, the hydraulic working oil is introduced into the inlet pipe again.

The cover 96A is fixed to the mounting foot 91A and the feed and discharge fixing base 92A over the mounting foot 91A and the feed and discharge fixing base 92A so as to protect the electronic control device 10A.

As described above, according to the electronic control device 10A of the first embodiment of the present invention, the first electronic board 30A is bonded to one of the surfaces of each of the separate beam members 20A serving as the thermally conductive support members, whereas the second electronic board 40A is bonded to the other surface of each of the separate beam members 20A.

Therefore, the separate beam members 20A serve as the support members for supporting the first electronic board 30A and the second electronic board 40A and thermal diffuser members at the same time. In addition, the separate beam members 20A ensure a distance between the first electronic board 30A and the second electronic board 40A. In this manner, the outer circuit components 31, 32, 41, and 42 and the inner circuit components 33 and 43 are mounted on the two surfaces of the electronic boards 30A and 40A, respectively.

Therefore, a mounting area can be increased without increasing a plane area of each of the first electronic board 30A and the second electronic board 40A. As a result, a plane area and a volume of the entire product can be reduced.

Moreover, the heat-generating components 32 and 42 mounted on the first electronic board 30A and the second electronic board 40A are opposed to the pair of separate beam members 20A which are bonded to each other through the adhesives 35 and 45. The temperature can be suppressed from being excessively increased locally because the heat generated from the heat-generating components 32 and 42 are diffused through the separate beam members 20.

Moreover, the space between the first electronic board 30A and the second electronic board 40A is filled with the exterior covering material 11 made of the synthetic resin to provide a non-hollow structure. In addition, at the time of pressure-molding of the synthetic resin, the synthetic resin is injected also into the space between the first electronic board 30A and the second electronic board 40A. Therefore, flexural deformation of the first electronic board 30A and the second electronic board 40A, specifically, the deformation to bring the first electronic board 30A and the second electronic board 40A close to each other at the time of pressure-molding of the synthetic resin, can be suppressed.

Moreover, the separation of solders on the circuit components 31, 32, 41, 42, 33, and 43 and the separation of the first electronic board 30A and the second electronic board 40A from the pair of separate beam members 20A and the exterior covering material 11 can be suppressed from occurring due to expansion and shrinkage of the air, which occurs with a change in environmental temperature during actual use.

Further, the weight of the separate beam members 20A is reduced and the sufficient distance between the separate beam members 20A can be ensured because each of the pair of separate beam members 20A is formed of the hollow cylindrical member.

Moreover, the hydraulic working oil serving as the cooling medium resides in or flows through the hollow portion of each of the separate beam members 20A. Therefore, the heat generated from the heat-generating components 32 and 42 mounted on both the first electronic board 30A and the second electronic board 40A can be efficiently diffused. In addition, even if the first electronic board 30A and the second electronic board 40A are provided close to each other, the temperature can be prevented from increasing in a locally concentrated manner in comparison with a single thermal diffuser plate for a single board on which the heat-generating components are mounted. Therefore, the electronic control device can be reduced in size.

Further, the pair of separate beam members 20A are connected to each other through the hollow connection portion 21. Therefore, the cooling member enters and exits the separate beam members 20A at one position. Therefore, a piping structure can be simplified.

Further, when the pair of separate beam members 20A are connected to each other through the connection plate 22, the portions of the first electronic board 30A and the second electronic board 40A, which are bonded to the separate beam members 20A with the adhesives 35 and 45, can be prevented from being separated even if a large external force is exerted on the exposed portions of the separate beam members 20A. As a result, the temperature of both of the electronic boards 30A and 40A can be suppressed from increasing.

Moreover, the window holes 23 are formed through the connection plate 22. Therefore, the inner circuit components 33 and 43 can be mounted respectively onto the first electronic board 30A and the second electronic board 40A through the window holes 23. As a result, workability in assembly is improved.

Further, the cooling-medium sensor 80a is provided to one of the separate beam members 20A. A signal detected by the cooling-medium sensor 80a is connected to the first electronic board 30A. Therefore, the detected signal can be directly fed to the electronic board 30A without passing through the external connection terminals. The cooling-medium sensor 80a is built in the transmission control device for the automobile transmission. Therefore, a signal wiring can be simplified.

When the temperature sensor serving as the simplified cooling-medium sensor 80b connected to the first electronic board 30A is provided in the area of the first electronic board 30A, which is opposed to one of the separate beam members 20A, the detected signal can be directly fed to the first electronic board 30A without passing through the external connection terminals. In addition, the cooling-medium sensor 80b can be built in the transmission control device for the automobile transmission. Therefore, the signal wiring can be simplified.

When the temperature sensor is employed as the cooling-medium sensor 80b, the small window 24, which is required for the separate beam members 20A in the case where the cooling-medium sensor 80a is used, is no longer required. Therefore, the cooling-medium sensor 80b can be readily applied to know an approximate temperature of the cooling medium.

Moreover, the series of external connection terminals 52a and 52b are located outside the pair of separate beam members 20A and are arranged in parallel to the separate beam members 20A, each extending in the longitudinal direction. Therefore, the mounting foot 91A and the feed and discharge fixing base 92A, which constitute a fixing and retaining mechanism of the separate beam members 20A, do not interfere with external wirings connected to the external connection terminals 52a and 52b. Thus, operability in connecting the external wirings to the external connection terminals 52a and 52b is improved.

Moreover, the first electronic board 30A and the second electronic board 40A are connected to each other at the position inside the pair of separate beam members 20A through the board-to-board connectors 38a and 38b. Thus, the position at which the external wirings are connected to the external connection terminals 52a and 52b and the position at which the wiring for connecting the separate beam members 20A is provided are separated from each other. Therefore, an outer size of the electronic control device can be reduced.

Second Embodiment

FIG. 8A is a top view of an electronic control device 10B according to a second embodiment of the present invention before sealing with a resin, and FIG. 8B is a right side view of FIG. 8A. FIG. 9A is a top view of the electronic control device 10B according to the second embodiment of the present invention, and FIG. 9B is a right side view of FIG. 9A.

The electronic control device 10B is a drive control device for a radiator fan which constitutes a part of a water-cooled automobile engine control device. The electronic control device 10B includes: a pair of separate beam members 20B; connection plates 22a and 22b; a first electronic board 30B; a second electronic board 40B; the plurality of external connection terminals 52a and 52b; and the exterior covering material 11. The pair of separate beam members 20B are hollow cylindrical thermally conductive support members made of, for example, a copper alloy. The connection plates 22a and 22b are bonded onto surfaces of each of the separate beam members 20B so as to connect the pair of separate beam members 20B to each other. The first electronic board 30B is bonded to be fixed to the upper surfaces of the respective separate beam members 20B, whereas the second electronic board 40B is bonded to be fixed to the lower surfaces of the respective separate beam members 20B. The plurality of external connection terminals 52a are provided on one side of the first electronic board 30B and the second electronic board 40B, whereas the plurality of external connection terminals 23b are provided on the side of the first electronic board 30B and the second electronic board 40B, which is opposite to the side on which the external connection terminals 52a are mounted. The exterior covering material 11 is a thermosetting resin which covers the entire first electronic board 30B, the entire second electronic board 40B, a part of each of the separate beam members 20B, and a part of each of the external connection terminals 52a and 52b.

Each of the separate beam members 20B serving as the support members has a hollow cylindrical shape. In the hollow, cooling water serving as the cooling medium resides in and flows.

The outer circuit components 31 and 32 are provided on one surface of the first electronic board 30B, which is formed of, for example, a glass epoxy board, whereas the inner circuit component 33 is provided on the other surface of the first electronic board 30B. The outer circuit components 31 and 32 are located outside the separate beam members 20B, whereas the inner circuit component 33 is located inside the separate beam members 20B. The outer circuit components 31 and 32 include the heat-generating components 32.

Opposite side end portions (two lateral edge portions) of the first electronic board 30B are bonded to be fixed to one surface of each of the separate beam members 20B with the adhesive 35 which is, for example, a thermosetting silicon resin composition. The heat-generating components 32 are mounted on each of the opposite side end portions of the first electronic board 30B. The heat-generating components 32 are adjacent to and opposed to the separate beam members 20B with the first electronic board 30B interposed therebetween.

The inner circuit component 33 is arranged between the pair of separate beam members 20B. A height size of the inner circuit component 33 is smaller than a thickness size of each of the separate beam members 20B so that the inner circuit component 33 does not abut against at least the second electronic board 40B.

As in the case of the first electronic board 30B, the outer circuit components 41 and 42 are mounted on one of the surfaces of the second electronic board 40B which is formed of a glass epoxy board, whereas the inner circuit component 43 is mounted on the other surface of the second electronic board 40B. The outer circuit components 41 and 42 include the heat-generating components 42.

Opposite side end portions of the second electronic board 40B are bonded to be fixed to a surface of each of the separate beam members 20B, which is opposite to the surface bonded to be fixed to the first electronic board 30B, through an intermediation of the adhesive 45 which is, for example, a thermosetting silicon resin composition. The heat-generating components 42 are mounted on the opposite side end portions of the second electronic board 40A, and are adjacent to and opposed to each other with the separate beam members 20B and the second electronic board 40B interposed therebetween.

The inner circuit component 43 is arranged between the pair of separate beam members 20B. A height size of the inner circuit component 43 is smaller than the thickness size of the separate beam members 20B so that the inner circuit component 43 does not abut against at least the first electronic board 30B.

In the electronic control device 10B according to this second embodiment, the first electronic board 30B and the second electronic board 40B are electrically connected to each other through bonding wires 53a and 53b instead of being connected through the board-to-board connectors 38a and 38b used in the first embodiment.

Moreover, the cooling-medium sensor 80a is provided to one of the separate beam members 20B, whereas the simplified cooling-medium sensor 80b is provided in an area of the first electronic board 30B, which is opposed to the other separate beam member 20B.

Figure 10:
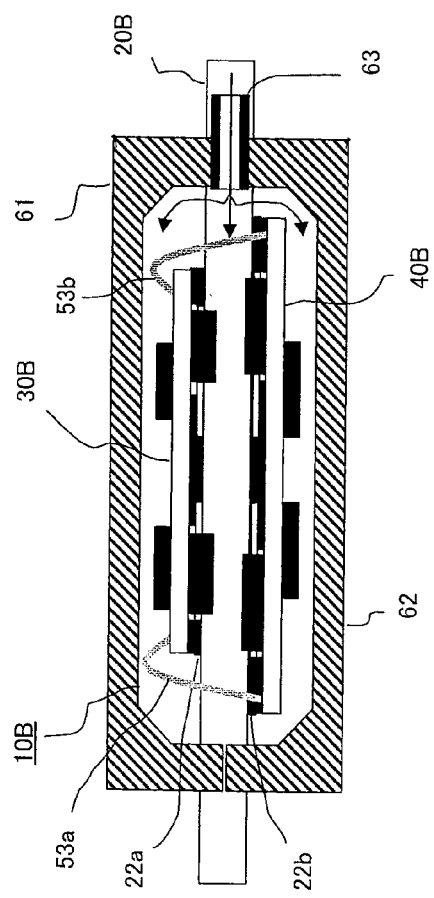
FIG. 10 is a sectional view illustrating the upper die and the lower die used for the electronic control device 10B.

FIG. 10 is a sectional view illustrating the upper die 61 and the lower die 62 used for the electronic control device 10B.

The dies 61 and 62 are integrated through temporary fixtures (not shown) provided inside the dies 61 and 62. Inside the dies 61 and 62, the electronic control device 10B before molding, in which the external connection terminals 52a and 52b are connected to each other respectively through the cutout connection portions 51a and 51b, is placed.

The resin injection port 63 passes from the right to the left on the paper plane of FIG. 10. Through the resin injection port 63, the synthetic resin serving as the thermosetting or thermoplastic resin which is heated and melted is injected under pressure into the space closed by the upper die 61 and the lower die 62.

After the injection of the synthetic resin from the resin injection port 63 under pressure, a flow of the synthetic resin is split into a stream flowing into a space above the first electronic board 30B, a stream flowing into an internal space surrounded by the first electronic board 30B, the second electronic board 40B, and the pair of separate beam members 20B, and a stream flowing into a space below the second electronic board 40B, as indicated by the arrows of FIG. 10. Then, the streams join together in a space on the side opposite to the resin injection port 63.

The structure in which the cooling-medium sensor 80a is mounted is the same as that illustrated in FIG. 4, and the structure in which the cooling-medium sensor 80b is mounted is the same as that described in the first embodiment.

However, the cooling medium is the hydraulic working oil used for the automobile transmission in the first embodiment, whereas the cooling medium is the cooling water flowing back to the radiator of the water-cooled automobile engine in this second embodiment.

The structure in which the heat-generating components 32 and 42 are mounted is the same as that illustrated in FIG. 5.

Figure 11A:
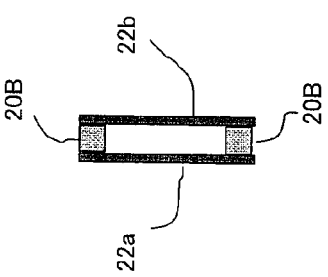
FIG. 11A is a top view illustrating the connection plates which connect the pair of separate beam members to each other.
Figure 11B:
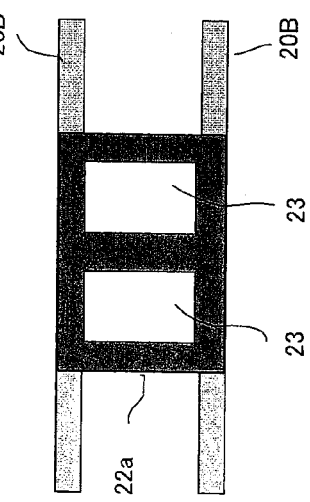
FIG. 11B is a right side view of FIG. 11A.

FIG. 11A is a top view illustrating the connection plates 22a and 22b which connect the pair of separate beam members 20B to each other, and FIG. 11B is a right side view of FIG. 11A.

The highly thermally conductive connection plates 22a and 22b are integrated with the pair of separate beam members 20B by welding, brazing, or bonding so that the pair of separate beam members 20B and 20B are thermally connected to each other.

Each of the connection plates 22a and 22b has a plurality of window holes 23 formed therein. Through the window holes 23, the inner circuit components 33 and 43 are mounted on the first electronic board 30B and the second electronic board 40B, respectively.

The number of the window holes 23 may also be one.

Figure 12A:
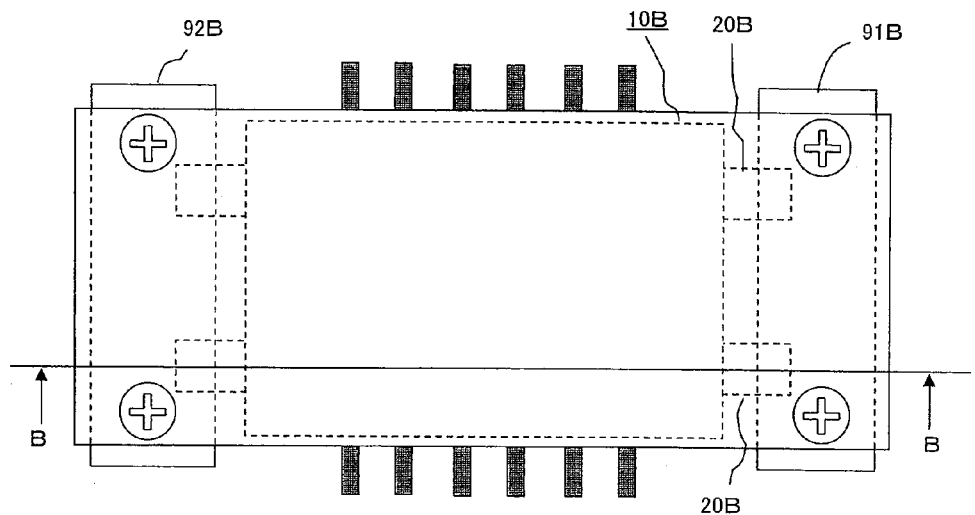
FIG. 12A is a view illustrating a state where the electronic control device is mounted, which is a top perspective view with a cover removed.
Figure 12B:
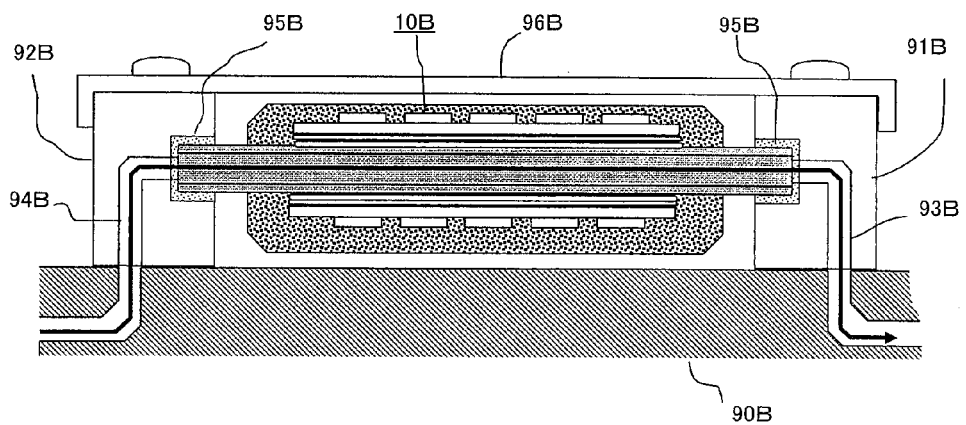
FIG. 12B is a sectional view taken along the line B-B of FIG. 12A.

FIG. 12A is a view illustrating a state where the electronic control device 10B is mounted, which is a top perspective view with a cover 96B removed, and FIG. 12B is a sectional view taken along the line B-B of FIG. 12A.

The electronic control device 10B is fixed to a mounting surface 90B of the radiator of the automobile engine through an intermediation of an outflow-side fixing base 91A and an inflow-side fixing base 92B.

The outflow-side fixing base 91B fixes an open end portion of each of the separate beam members 20B, which is externally exposed, through a packing 95B. To the outflow-side fixing base 91B, an end of an outflow pipe 93B in communication with the separate beam members 20B, through which cooling water flows, is connected.

The inflow-side fixing base 92B fixes the other open end of each of the separate beam members 20B, which is externally exposed, through another packing 95B. To the inflow-side fixing base 92B, an end of an inflow pipe 94B in communication with the pair of separate beam members 20B, through which cooling water flows, is connected.

The cover 96B is fixed to the outflow-side fixing base 91B and the inflow-side fixing base 92B over the outflow-side fixing base 91B and the inflow-side fixing base 92B so as to protect the electronic control device 10B.

Next, the functions and effects of the electronic control device 10B according to the second embodiment of the present invention are described. Herein, differences of the electronic control device 10B from the electronic control device 10A described in the first embodiment are mainly described.

According to the electronic control device 10B of the second embodiment, the pair of separate beam members 20B are connected to each other by the thermally conductive connection plates 22a and 22b which are integrated with each other by welding, brazing, or bonding. Therefore, the portions of the first electronic board 30B and the second electronic board 40B, which are bonded with the adhesives 35 and 45 to the separate beam members 20B, are prevented from being separated even if a large external force is exerted on the exposed portions of the separate beam members 20B. As a result, the temperature of both of the electronic boards 30B and 40B can be prevented from increasing.

Moreover, the window holes 23 are formed through the connection plates 22a and 22b. Thus, the inner circuit components 33 and 43 can be mounted onto the first electronic board 30B and the second electronic board 40B through the window holes 23. As a result, workability in assembly is improved.

Moreover, the series of external connection terminals 52a and 52b are located outside the pair of separate beam members 20B and are arranged in parallel to the separate beam members 20B, each extending in the longitudinal direction. Therefore, the outflow-side fixing base 91B and the inflow-side fixing base 92B which retain the separate beam members 20B do not interfere with the external wirings connected to the external connection terminals 52a and 52b. Thus, operability in connecting the external wirings to the external connection terminals 52a and 52b is improved.

Moreover, the first electronic board 30B and the second electronic board 40B are connected to each other at the position inside the pair of separate beam members 20B by the bonding wires 53a and 53b. Therefore, the position at which the external wirings are connected to the external connection terminals 52a and 52b and the position at which the separate beam members 20B are connected by the bonding wires 53a and 53b are separated from each other. As a result, the outer size of the electronic control device 10B can be reduced.

Further, the cooling-medium sensor 80a is provided to one of the separate beam members 20B. A signal detected by the cooling-medium sensor 80a is connected to the first electronic board 30B. Therefore, the detected signal can be directly fed to the electronic board 30B without passing through the external connection terminals. The cooling-medium sensor 80a is built in the drive control device for the radiator fan. Therefore, a signal wiring can be simplified.

Further, the temperature sensor which is the simplified cooling-medium sensor 80b connected to the first electronic board 30B is provided in the area of the first electronic board 30B, which is opposed to one of the separate beam members 20B. Therefore, the detected signal can be directly fed to the first electronic board 30B without passing through the external connection terminals. The signal wiring can be simplified because the cooling-medium sensor 80b is built in the driving control device for the radiator fan.

Third Embodiment

Figure 13B:
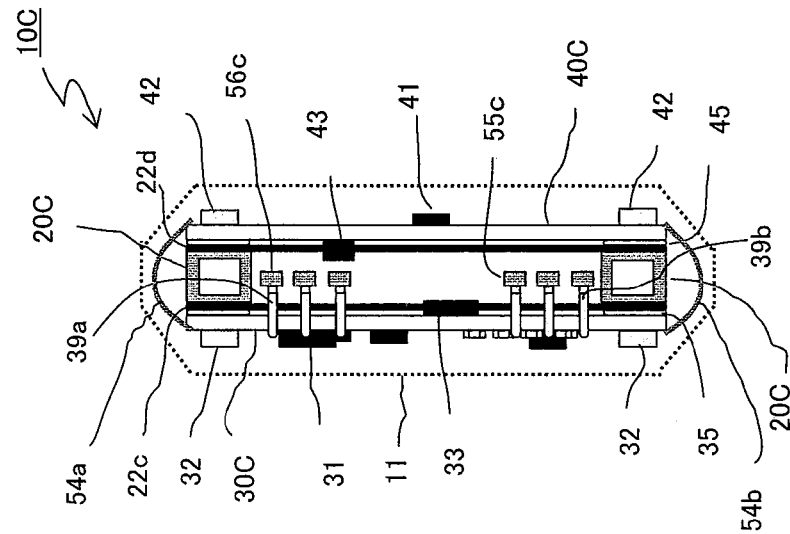
FIG. 13B is a right side view of FIG. 13A.
Figure 13A:
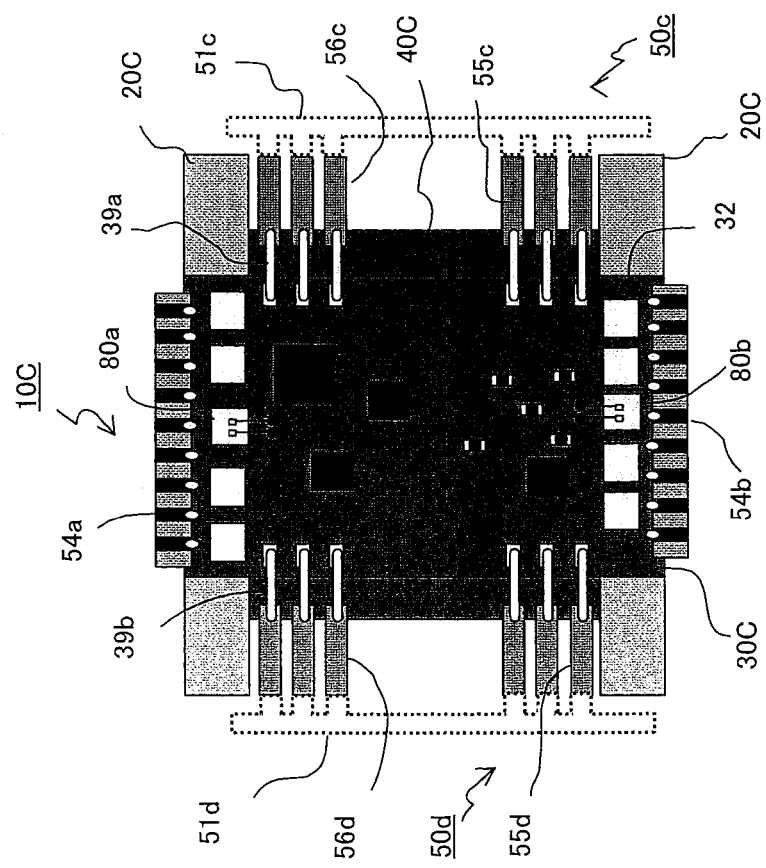
FIG. 13A is a top view of an electronic control device 100 according to a third embodiment of the present invention before sealing with a resin.
Figure 14B:
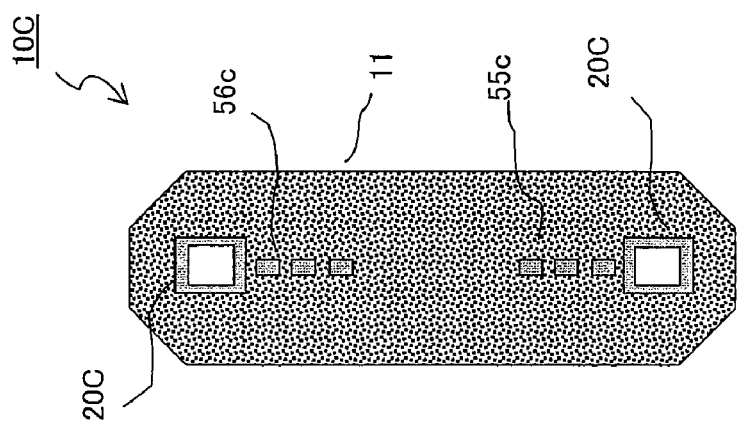
FIG. 14B is a right side view of FIG. 14A.
Figure 14A:
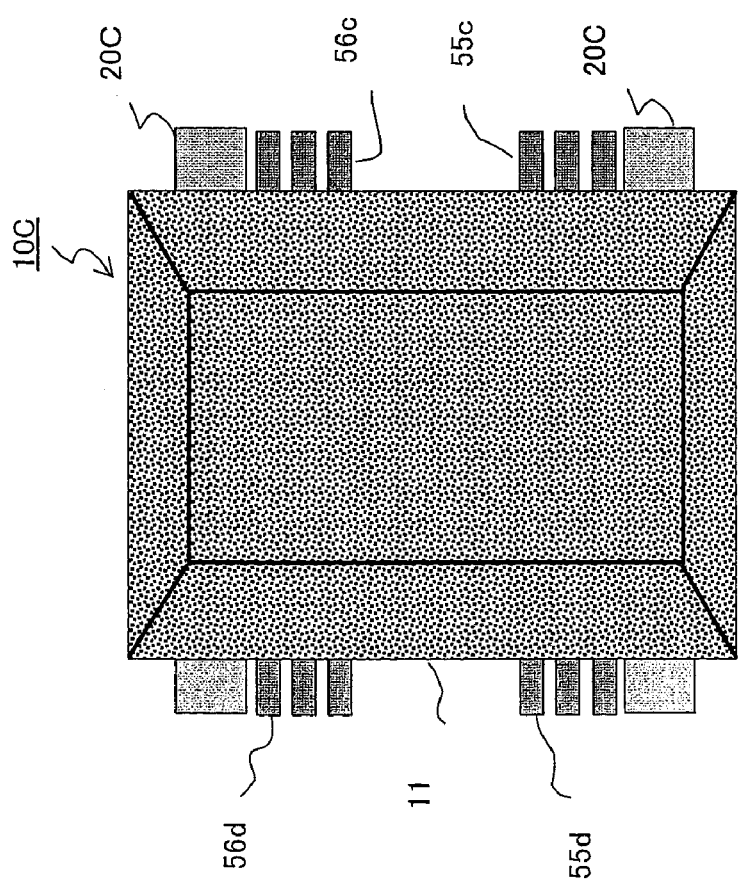
FIG. 14A is a top view of the electronic control device according to the third embodiment of the present invention.

FIG. 13A is a top view of an electronic control device 100 according to a third embodiment of the present invention before sealing with a resin, and FIG. 13B is a right side view of FIG. 13A. FIG. 14A is a top view of the electronic control device 10C according to the third embodiment of the present invention, and FIG. 14B is a right side view of FIG. 14A.

The electronic control device 10C is a transmission control device for an automobile transmission. The electronic control device 10C includes: a pair of separate beam members 20C; connection plates 22c and 22d; a first electronic board 30C; a second electronic board 40C; a plurality of external connection terminals 55c, 55d, 56c, and 56d; flexible boards 54a and 54b; and the exterior covering material 11. The pair of separate beam members 20C are hollow cylindrical thermally conductive support members made of, for example, a copper alloy. The connection plates 22c and 22d are respectively bonded onto two surfaces of each of the separate beam members 20C so as to connect the pair of separate beam members 20C to each other. The first electronic board 30C is bonded to be fixed to the upper surfaces of the respective separate beam members 20C, whereas the second electronic board 40C is bonded to be fixed to the lower surfaces of the respective separate beam members 20C. The plurality of external connection terminals 55c and 56c are provided on one side of the first electronic board 30C and the second electronic board 40C, whereas the external connection terminals 55d and 56d are provided on the other side of the first electronic board 30C and the second electronic board 40C, which is opposite to the side where the external connection terminals 55c and 56c are provided. The plurality of external connection terminals 55c, 55d, 56c, and 56d are located inside and between the pair of separate beam members 20C. The flexible boards 54a and 54b electrically connect the first electronic board 30C and the second electronic board 40C to each other. The exterior covering material 11 is a thermosetting resin which covers the entire first electronic board 30C, the entire second electronic board 40C, the separate beam members 20C, and a part of each of the external connection terminals 55c, 55d, 56c, and 56d.

Each of the separate beam members 20C has a hollow cylindrical shape. In the hollow, hydraulic working oil serving as the cooling medium resides in and flows.

The outer circuit components 31 and 32 are provided on one surface of the first electronic board 30C, which is formed of, for example, a glass epoxy board, whereas the inner circuit component 33 is provided on the other surface of the first electronic board 30C. The outer circuit components 31 and 32 include the heat-generating components 32.

Opposite side end portions (two lateral edge portions) of the first electronic board 30C are bonded to be fixed to one surface of each of the separate beam members 20C with the adhesive 35 which is, for example, a thermosetting silicon resin composition. The heat-generating components 32 are mounted on each of the opposite side end portions of the first electronic board 30C. The heat-generating components 32 are adjacent to and opposed to the separate beam members 20C with the first electronic board 30C interposed therebetween.

The inner circuit component 33 is arranged between the pair of separate beam members 20C. A height size of the inner circuit component 33 is smaller than a thickness size of each of the separate beam members 20C so that the inner circuit component 33 does not abut against at least the second electronic board 40C.

As in the case of the first electronic board 30C, the outer circuit components 41 and 42 are mounted on one of the surfaces of the second electronic board 40C which is formed of a glass epoxy board, whereas the inner circuit component 43 is mounted on the other surface of the second electronic board 40C. The outer circuit components 41 and 42 include the heat-generating components 42.

Opposite side end portions of the second electronic board 40C are bonded to be fixed to a surface of each of the separate beam members 20C, which is opposite to the surface bonded to be fixed to the first electronic board 30C, through an intermediation of the adhesive 45 which is, for example, a thermosetting silicon resin composition. The heat-generating components 42 are mounted on the opposite side end portions of the second electronic board 40C, and are adjacent to and opposed to each other with the separate beam members 20C and the second electronic board 40C interposed therebetween.

The inner circuit component 43 is arranged between the pair of separate beam members 20C. A height size of the inner circuit component 43 is smaller than the thickness size of the separate beam members 20C so that the inner circuit component 43 does not abut against at least the first electronic board 30C.

On one of the separate beam members 20C, the cooling-medium sensor 80a for detecting the temperature or the pressure is mounted in the same structure as that illustrated in FIG. 4.

Moreover, the simplified cooling-medium sensor 80b for indirectly detecting the temperature of the cooling medium is mounted in an area of the first electronic board 30C, which is opposed to the other separate beam member 20C.

In this embodiment, the flexible boards 54a and 54b are used in place of the board-to-board connectors 38a and 38b used in the first embodiment. Pairs of copper-foil lands for connecting the boards (not shown) are provided in side portions of the first electronic board 30C and the second electronic board 40C, which are parallel to the separate beam members 20C. Both ends of the flexible boards 54a and 54b are respectively bonded to the copper-foil lands for connecting the boards. As a result, the first electronic board 30C and the second electronic board 40C are electrically connected to each other.

The second electronic board 40C is connected to the external connection terminals 55c, 55d, 56c, and 56d through the flexible boards 54a and 54b, the first electronic board 30C, and the bonding wires 39a and 39b.

The series of external connection terminals 55c, 55d, 56c, and 56d are arranged vertically to the separate beam members 20C. The external connection terminals 55c, 55d, 56c, and 56d are connected to connection lands of the first electronic board 30C through an intermediation of the bonding wires 39a and 39b which are, for example, thin aluminum wires.

The plurality of external connection terminals 55c and 56c initially constitute a terminal-group plate 50c in which the external connection terminals 55c and 56c are connected to each other by a cutout connection portion 51c, whereas the plurality of external terminals 55d and 56d constitute a terminal-group plate 50d in which the external connection terminals 55d and 56d are connected to each other by a cutout connection portion 51d. In the final step of assembly, the cutout connection portions 51c and 51d are cut out to separate the plurality of external connection terminals 55c, 56c, 55d, and 56d into individual pieces.

The plurality of external connection terminals 55c, 55d, 56c, and 56d are grouped into an upper group and a lower group, that is, a first group including the external connection terminals 55c and 55d and a second group including the external connection terminals 56c and 56d. For example, at an intermediate position between the external connection terminals 55c of the first group and the external connection terminals 56c of the second group, the resin injection port 63 for the dies, which is described below and illustrated in FIG. 15, is located.

The plurality of external connection terminals 55c, 55d, 56c, and 56d may be grouped into three or more groups.

Figure 15:
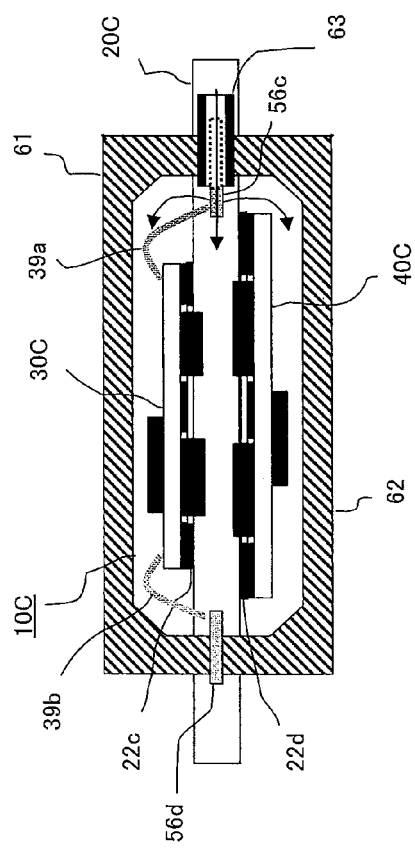
FIG. 15 is a sectional view illustrating the upper die and the lower die used for the electronic control device.

FIG. 15 is a sectional view illustrating the upper die 61 and the lower die 62 used for the electronic control device 100.

The dies 61 and 62 are integrated through temporary fixtures (not shown) provided inside the dies 61 and 62. Inside the dies 61 and 62, the electronic control device 10C before molding, in which the external connection terminals 55c, 55d, 56c, and 56d are connected to each other through the cutout connection portions 51c and 51d, is placed.

The resin injection port 63 passes from the right to the left on the paper plane of FIG. 15. Through the resin injection port 63, the synthetic resin serving as the thermosetting or thermoplastic resin which is heated and melted is injected under pressure into the space closed by the upper die 61 and the lower die 62.

After the injection of the synthetic resin from the resin injection port 63 under pressure, a flow of the synthetic resin is split into a stream flowing into a space above the first electronic board 30C, a stream flowing into an internal space surrounded by the first electronic board 30C, the second electronic board 40C, and the pair of separate beam members 20C, and a stream flowing into a space below the second electronic board 40C, as indicated by the arrows of FIG. 15. Then, the streams join together in a space on the side opposite to the resin injection port 63.

Figure 16B:
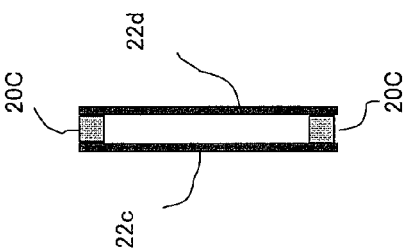
FIG. 16B is a right side view of FIG. 16A.
Figure 16A:
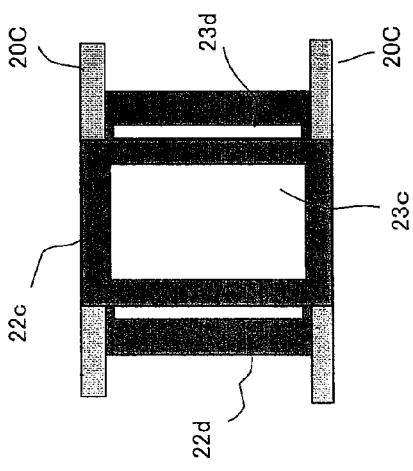
FIG. 16A is a top view illustrating the connection plates, each connecting the pair of separate beam members to each other.

FIG. 16A is a top view illustrating the connection plates 22c and 22d, each connecting the pair of separate beam members 20C to each other, and FIG. 16B is a right side view of FIG. 16A.

The highly thermally conductive connection plates 22c and 22d are integrated with the pair of separate beam members 20C by welding, brazing, or bonding so that the pair of separate beam members 20C are thermally connected to each other.

A window hole 23c is formed in the connection plate 22c, whereas a window hole 23d is formed in the connection plate 22d. Through the window hole 23, the inner circuit components 33 and 43 are mounted on the first electronic board 30C and the second electronic board 40C.

The number of each of the window holes 23c and 23d may be plural.

Figure 17A:
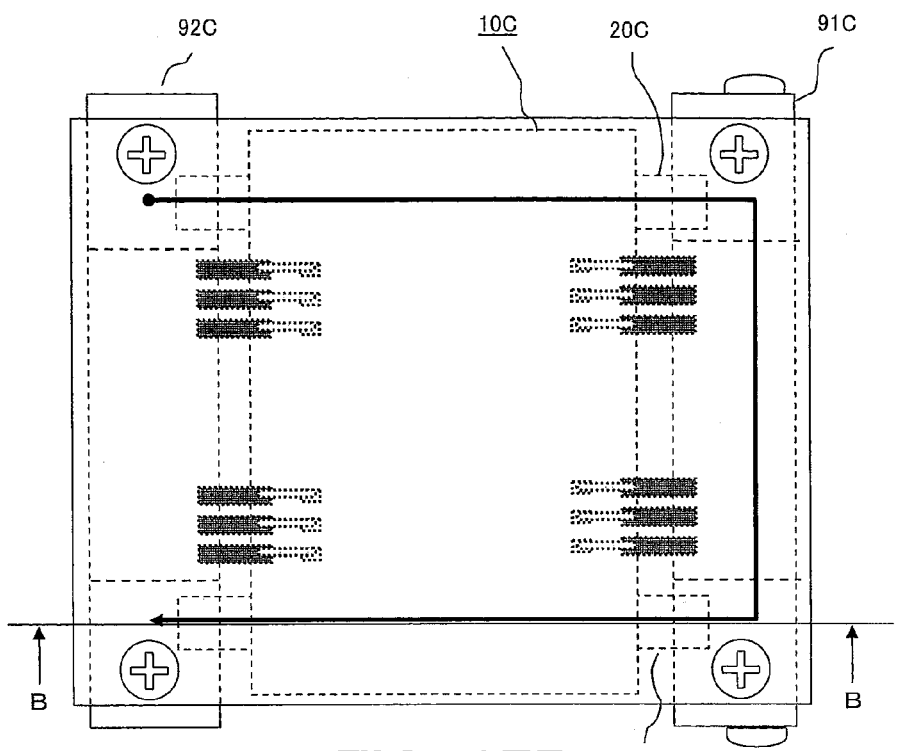
FIG. 17A is a view illustrating a state where the electronic control device 10C is mounted, which is a top perspective view with a cover removed.
Figure 17B:
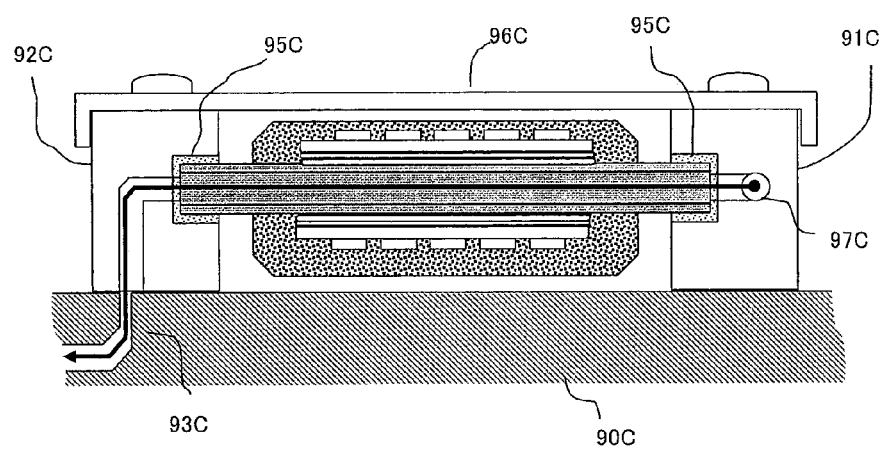
FIG. 17B is a sectional view taken along the line B-B of FIG. 17A.

FIG. 17A is a view illustrating a state where the electronic control device 10C is mounted, which is a top perspective view with a cover 96C removed, and FIG. 17B is a sectional view taken along the line B-B of FIG. 17A.

The electronic control device 10C is fixed to a mounting surface 90C of the gear box of the automobile transmission through an intermediation of a reflux fixing base 91C and a feed and discharge fixing base 92C.

The reflux fixing base 91C fixes an open end portion of each of the separate beam members 20C, which is externally exposed, through a packing 95C. In the reflux fixing base 91C, a circulating flow path 97C in communication with the open end portion of each of the separate beam members 20C, through which the hydraulic working oil flows, is formed.

The feed and discharge fixing base 92C fixes the other open end portion of each of the separate beam members 20C, which is externally exposed, through another packing 95C. To one end of the feed and discharge fixing base 92C, an end of an outflow pipe 93C in communication with one of the separate beam members 20C, through which the hydraulic working oil flows, is connected. To the other end of the feed and discharge fixing base 92C, an end of an inflow pipe (not shown) in communication with the other separate beam member 20C, through the hydraulic working oil flows, is connected.

The cover 96C is fixed to the reflux fixing base 91C and the feed and discharge fixing base 92C over the reflux fixing base 91C and the feed and discharge fixing base 92C so as to protect the electronic control device 100.

In the electronic control device 10A of the first embodiment, the open end portions of the pair of separate beam members 20A are connected through an intermediation of the connection portion 21 as illustrated in FIG. 1. On the other hand, in the electronic control device 10C of this third embodiment, the circulating flow path 97C provided in the reflux fixing base 91C has the function of the connection portion 21.

However, the electronic control device 10C can be used in the case where the pair of separate beam members 20B function as the parallel flow paths as in the case of the electronic control device 10B of the second embodiment illustrated in FIG. 8.

Next, the functions and effects of the electronic control device 10C of the third embodiment of the present invention are described. Herein, differences of the electronic control device 10C from the electronic control device 10A of the first embodiment are mainly described.

In the electronic control device 10C according to the third embodiment, the pair of separate beam members 20C are connected to each other by the thermally conductive connection plates 22c and 22d which are integrated with the separate beam members 20C by welding, brazing, or bonding. Therefore, even if a large external force is exerted on the exposed portion of each of the separate beam members 20C, the portions of the first electronic board 30C and the second electronic board 40C, which are bonded to the separate beam members 20C with the adhesives 35 and 45, are prevented from being separated. As a result, a temperature of both of the electronic boards 30C and 40C is prevented from increasing.

Moreover, the window hole 23c is formed in the connection plate 22c, whereas the window hole 23d is formed in the connection plate 22d. Thus, the inner circuit components 33 and 43 can be mounted respectively on the first electronic board 30C and the second electronic board 40C through the window holes 23c and 23d. As a result, operability in assembly is improved.

Further, in the electronic control device 10A of the first embodiment and the electronic control device 10B of the second embodiment, the external connection terminals 52a and 52b are arranged in parallel to the separate beam members 20A or 20B as illustrated in FIGS. 1 and 8. On the other hand, in the electronic control device 100 of the third embodiment, the external connection terminals 55c, 55d, 56c, and 56d are arranged vertically to the separate beam members 20C, as illustrated in FIG. 13A.

Therefore, a longitudinal size of each of the pair of separate beam members 20C of the electronic control device 10C according to this third embodiment is reduced as compared with that of each of the separate beam members 20A of the electronic control device 10A of the first embodiment and that of the separate beam members 20B of the electronic control device 10B of the second embodiment. On the other hand, a distance between the pair of separate beam members 20C is increased.

Further, the plurality of external connection terminals 55c, 55d, 56c, and 56d are arranged vertically to the pair of separate beam members 20C inside the pair of separate beam members 20C. The external connection terminals 55c, 55d, 56c, and 56d are grouped into the first group including the external connection terminals 55c and 55d and the second group including the external connection terminals 56c and 56d. At the intermediate position between the first group and the second group, the resin is injected through the resin injection port 63.

Thus, the reflux fixing base 91C and the feed and discharge fixing base 92C, which are the fixing and retaining mechanism for the separate beam members 10C, and the external wirings connected to the external connection terminals 55c, 55d, 56c, and 56d are provided in a concentrated manner. Therefore, an operation of mounting the separate beam members 10C and an operation of providing the external wirings are facilitated.

Moreover, the position of the resin injection port 63 for the dies 61 and 62 is separated away from the external connection terminals 55c, 55d, 56c, and 56d. Therefore, the structure of the dies 61 and 62 is simplified.

Further, the cooling-medium sensor 80a is provided to one of the separate beam members 20C. A signal detected by the cooling-medium sensor 80a is connected to the first electronic board 30C. Therefore, the detected signal can be directly fed to the electronic board 30C without passing through the external connection terminals. The cooling-medium sensor 80a is built in the transmission control device for the automobile transmission. Therefore, a signal wiring can be simplified.

Further, the temperature sensor which is the simplified cooling-medium sensor 80b connected to the first electronic board 30C is provided in the area of the first electronic board 30C, which is opposed to one of the separate beam members 20C. Therefore, the detected signal can be directly fed to the first electronic board 30C without passing through the external connection terminals. The signal wiring can be simplified because the cooling-medium sensor 80b is built in the transmission control device for the automobile transmission.

Fourth Embodiment

Figure 18A:
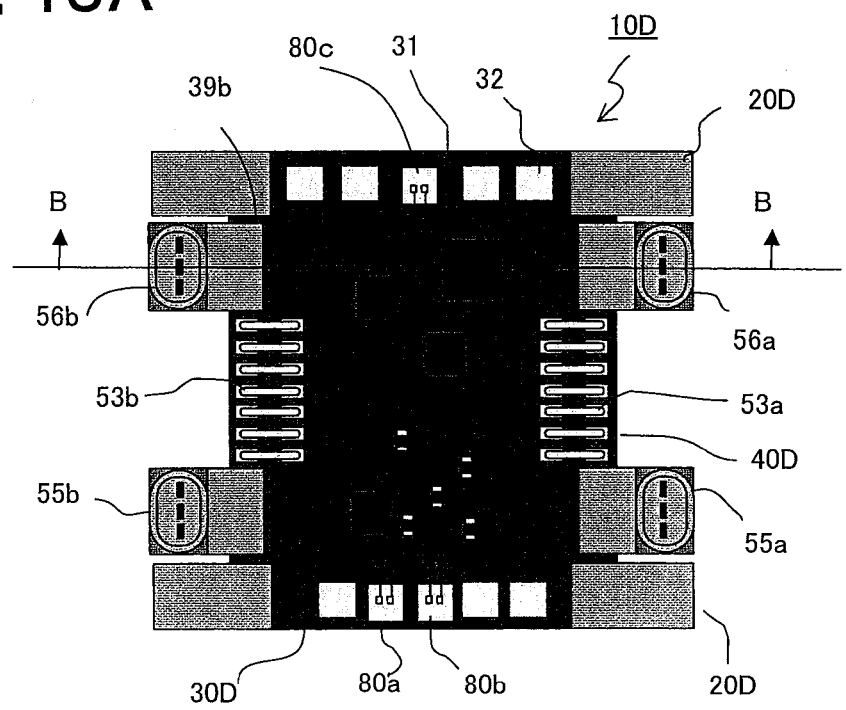
FIG. 18A is a top view of an electronic control device according to a fourth embodiment of the present invention before sealing with a resin.
Figure 18B:
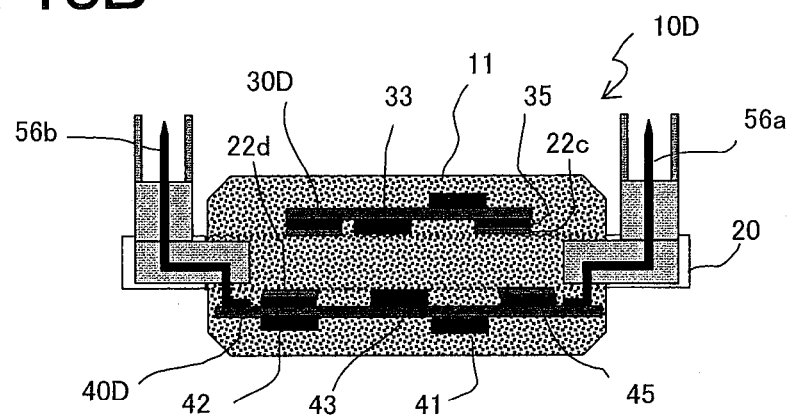
FIG. 18B is a right side view of FIG. 18A.
Figure 19:
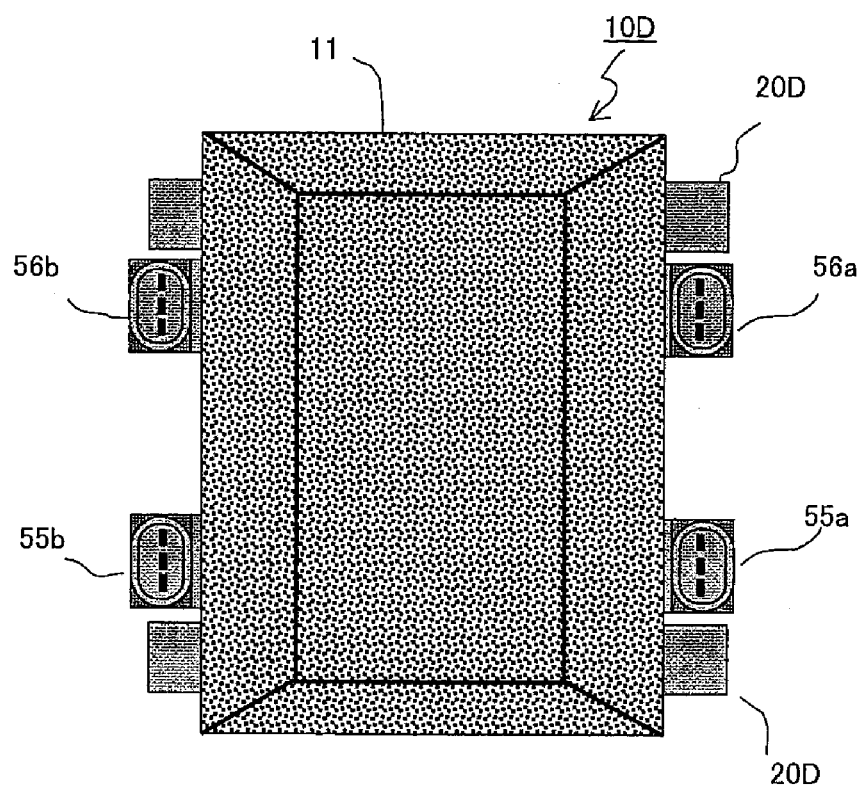
FIG. 19 is a top view of the electronic control device according to the fourth embodiment of the present invention.

FIG. 18A is a top view of an electronic control device 10D according to a fourth embodiment of the present invention before sealing with a resin, and FIG. 18B is a right side view of FIG. 18A. FIG. 19 is a top view of the electronic control device 10D according to the fourth embodiment of the present invention.

The electronic control device 10D is an intake-air amount detection control device as a part of an automobile engine control device. The electronic control device 10D includes: a pair of separate beam members 20D; the connection plates 22c and 22d; a first electronic board 30D; a second electronic board 40D; a plurality of external connection terminals 55a, 55b, 56a, and 56b; the bounding wires 53a and 53b; and the exterior covering material 11. The pair of separate beam members 20D are hollow cylindrical thermally conductive support members made of, for example, a copper alloy. The connection plates 22c and 22d are respectively bonded onto two surfaces of each of the pair of separate beam members 20D so as to connect the pair of separate beam members 20D to each other. The first electronic board 30D is bonded to be fixed to the upper surfaces of the respective separate beam members 20D, whereas the second electronic board 40D is bonded to be fixed to the lower surfaces of the respective separate beam members 20D. The bounding wires 53a and 53b electrically connect the first electronic board 30D and the second electronic board 40D to each other. The exterior covering material 11 is a thermosetting resin which covers the entire first electronic board 30D, the entire second electronic board 40D, the separate beam members 20D, and a part of each of the external connection terminals 55a, 55b, 56a, and 56b.

Each of the separate beam members 20D has a hollow cylindrical shape. Inside the separate beam members 20D, intake atmospheric air for an engine serving as the cooling medium flows.

The outer circuit components 31 and 32 are provided on one surface of the first electronic board 30D, which is formed of, for example, a glass epoxy board, whereas the inner circuit component 33 is provided on the other surface of the first electronic board 30D. The outer circuit components 31 and 32 include the heat-generating components 32.

Opposite side end portions of the first electronic board 30D are bonded to be fixed to one surface of each of the separate beam members 20D with the adhesive 35 which is, for example, a thermosetting silicon resin composition. The heat-generating components 32 are mounted on each of the opposite side end portions of the first electronic board 30D. The heat-generating components 32 are adjacent to and opposed to the separate beam members 20D with the first electronic board 30D interposed therebetween.

The inner circuit component 33 is arranged between the pair of separate beam members 20D. A height size of the inner circuit component 33 is smaller than a thickness size of each of the separate beam members 20D so that the inner circuit component 33 does not abut against at least the second electronic board 40D.

As in the case of the first electronic board 30D, the outer circuit components 41 and 42 are mounted on one of the surfaces of the second electronic board 40D which is formed of a glass epoxy board, whereas the inner circuit component 43 is mounted on the other surface of the second electronic board 40D. The outer circuit components 41 and 42 include the heat-generating components 42.

Opposite side end portions (two lateral edge portions) of the second electronic board 40D are bonded to be fixed to a surface of each of the separate beam members 20D, which is opposite to the surface bonded to be fixed to the first electronic board 30D, through an intermediation of the adhesive 45 which is, for example, a thermosetting silicon resin composition. The heat-generating components 42 are mounted on the opposite side end portions of the second electronic board 40D, and are adjacent to and opposed to each other with the separate beam members 20D and the second electronic board 40D interposed therebetween.

The inner circuit component 43 is arranged between the pair of separate beam members 20D. A height size of the inner circuit component 43 is smaller than the thickness size of the separate beam members 20D so that the inner circuit component 43 does not abut against at least the first electronic board 30D.

On one of the separate beam members 20D, the cooling-medium sensor 80a for detecting the temperature or the pressure is mounted in the same structure as that illustrated in FIG. 4.

The simplified cooling-medium sensor 80b for indirectly detecting a temperature of the intake atmospheric air serving as the cooling medium may be mounted on an area of the first electronic board 30D, which is opposed to one of the separate beam members 20D, in place of the cooling-medium sensor 80a, as illustrated in FIG. 18A.

Figure 20A:
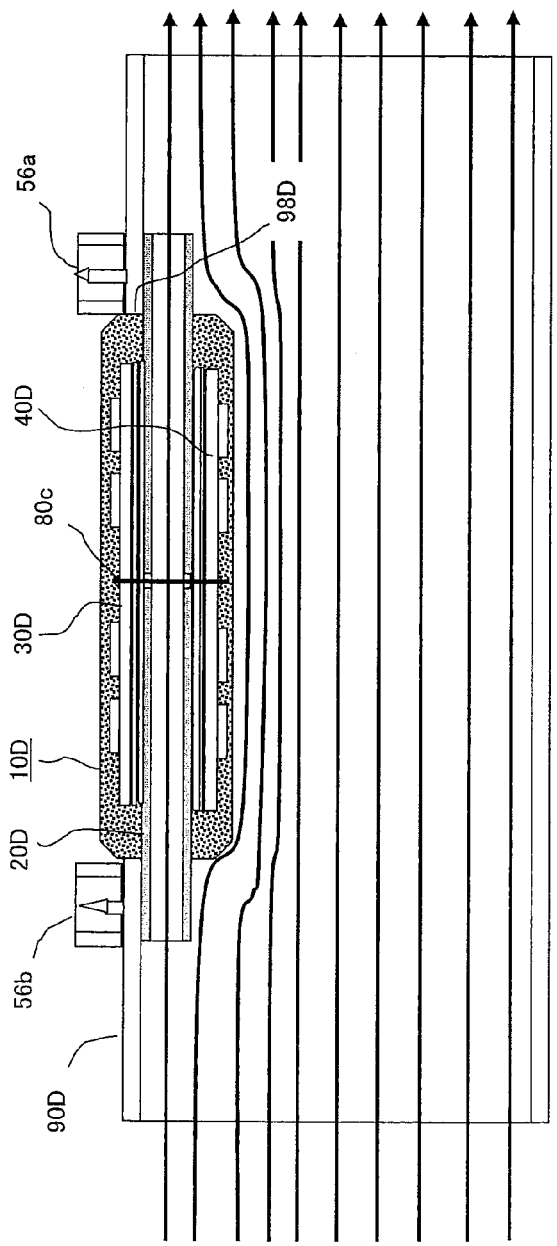
FIG. 20A is a sectional view illustrating a state where the electronic control device illustrated in FIG. 19 is mounted.
Figure 20B:
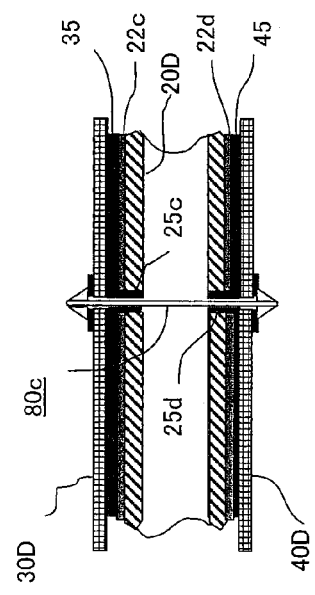
FIG. 20B is an enlarged sectional view of a principal part of FIG. 20A.

On an area of the first electronic board 30D, which is on the other separate beam member 20D side, a cooling-medium sensor 80c, which is described below referring to FIGS. 20A and 20B, is provided.

In this fourth embodiment, the bonding wires 53a and 53b are used in place of the board-to-board connectors 38a and 38b used in the first embodiment.

The first electronic board 30D is connected to the external connection terminals 55a, 55b, 56a, and 56b through the bonding wires 53a and 53b and the second electronic board 40D.

The plurality of external connection terminals 55a, 55b, 56a, and 56b, which are bonded to an upper part and a lower part of each of opposite side end portions of the second electronic board 40D by soldering are arranged so as to extend vertically to the separate beam members 20D.

The plurality of external connection terminals 55a, 55b, 56a, and 56b are grouped into an upper group and a lower group, that is, a first group including the external connection terminals 55a and 55b and a second group including the external connection terminals 56a and 56b. For example, at an intermediate position between the first group including the external connection terminals 55a and 55b and the second group including the external connection terminals 56a and 56b, the resin injection port 63 illustrated in FIG. 15 is located.

The plurality of external connection terminals 55a, 55b, 56a, and 56b may be grouped into three or more groups.

The structure in which the heat-generating components 32 and 42 are mounted is the same as that illustrated in FIG. 5.

A structure of each of the connection plates 22c and 22d is the same as that illustrated in FIGS. 16A and 16B.

FIG. 20A is a sectional view illustrating a state where the electronic control device 10D illustrated in FIG. 19 is mounted, and FIG. 20B is an enlarged sectional view of a principal part of FIG. 20A.

A mounting surface 90D is a wall body of an intake pipe of an automobile engine, on which the electronic control device 10D is mounded. A mounting window hole 98D is formed in the intake pipe. The electronic control device 10D is fitted into the mounting window hole 98D so as to be fixed to the mounting surface 90D.

The pair of separate beam members 20D are located inside the intake pipe so that the intake atmospheric air flows into and passes therethrough.

The cooling-medium sensor 80c which is a hot-wire flow rate sensor is provided to one of the separate beam members 20D.

The cooling-medium sensor 80c is, for example, a hot wire made of platinum, which is provided to pass through small windows 25c and 25d formed through one of the separate beam members 20D so as to bridge the small windows 25c and 25d. Both ends of the cooling-medium sensor 80c are respectively exposed from the first electronic board 30D and the second electronic board 40D to be soldered.

The hot-wire flow rate sensor includes a wire having an electric resistance varying depending on the temperature, inside the intake pipe. A current is allowed to flow through the wire to heat and keep the wire at a constant temperature. At this time, the degree of cooling for the wire changes according to the flow rate of intake air. Therefore, the current value which is required to keep the wire at the constant temperature also changes. Thus, the amount of intake air is calculated by measuring the current value.

As described above, the electronic control device 10D is the intake-air amount detection control device for precisely detecting the amount of intake air by using the intake-air amount sensor, which constitutes a part of the engine control device. The detection control device is provided inside the intake pipe of the engine. Therefore, the intake atmospheric air flows inside the separate beam members 20D. The cool-ing-medium sensor 80c is used as the flow rate sensor for measuring the intake air flow rate.

The cooling-medium sensor 80a may also be used as a temperature sensor for measuring a temperature of the intake atmospheric air or a pressure sensor for measuring a pressure of the intake atmospheric air.

Next, the functions and effects of the electronic control device 10D according to the fourth embodiment of the present invention are described. Herein, differences of the electronic control device 10D from the electronic control device 10A described in the first embodiment are mainly described.

According to the electronic control device 10D of the fourth embodiment, the pair of separate beam members 20D are connected to each other by the thermally conductive connection plates 22c and 22d which are integrated with the separate beam members 20D by welding, brazing, or bonding. Therefore, the portions of the first electronic board 30D and the second electronic board 40D, which are bonded with the adhesives 35 and 45 to the separate beam members 20D, are prevented from being separated even if a large external force is exerted on the exposed portions of the separate beam members 20D. As a result, the temperature of both of the electronic boards 30D and 40D can be prevented from increasing.

The cooling-medium sensor 80c serving as the flow rate sensor is provided to one of the separate beam members 20D. A signal detected by the cooling-medium sensor 80c is connected to the first electronic board 30D and the second electronic board 40D. Therefore, the cooling-medium sensor 80c is integrated with the first electronic board 30D and the second electronic board 40D. As a result, the detected signal can be directly fed to the electronic boards 30D and 40D without passing through the external connection terminals.

Further, the plurality of external connection terminals 55a, 55b, 56a, and 56b are arranged vertically to the pair of separate beam members 20D inside the pair of separate beam members 20D. The external connection terminals 55a, 55b, 56a, and 56b are grouped into the first group including the external connection terminals 55a and 55b and the second group including the external connection terminals 56a and 56b. At the intermediate position between the first group and the second group, the resin is injected through the resin injection port 63.

Thus, in the device in which a retaining mechanism for retaining the separate beam members 20D, and the external wirings connected to the external connection terminals 55a, 55b, 56a, and 56b are provided in a concentrated manner, an operation of mounting the separate beam members 20D and an operation of providing the external wirings are facilitated.

Moreover, the position of the resin injection port 63 for the dies 61 and 62 is separated away from the external connection terminals 55a, 55b, 56a, and 56b. Therefore, the structure of the dies 61 and 62 is simplified.

Further, the cooling-medium sensor 80a is provided to one of the separate beam members 20D. A signal detected by the cooling-medium sensor 80a is connected to the first electronic board 30D. Therefore, the detected signal can be directly fed to the electronic board 30D without passing through the external connection terminals. The cooling-medium sensor 80a is built in the intake-air amount detection control device. Therefore, a signal wiring can be simplified.

Further, the temperature sensor which is the simplified cooling-medium sensor 80b connected to the first electronic board 30D is provided in the area of the first electronic board 30D, which is opposed to one of the separate beam members 20D. Therefore, the detected signal can be directly fed to the first electronic board 30D without passing through the external connection terminals. The signal wiring can be simplified because the cooling-medium sensor 80*b* is built in the intake-air amount detection control device.

In the electronic control devices 10A to 10D according to the first to fourth embodiments, each of the first electronic boards 30A to 30D is the epoxy resin board including the outer surface on which the heat-generating components 32 and the outer circuit component 31 are mounted and the inner surface on which the inner circuit component 33 is mounted, whereas each of the second electronic boards 40A to 40D is the epoxy resin board including the outer surface on which the heat-generating components 42 and the outer circuit components 41 are mounted and the inner surface on which the inner circuit component 43 is mounted. However, the present invention is applicable to, for example, an electronic control device which includes a multilayered high-density double-sided mounting board having no heat-generating component as the first electronic board 30A, 30B, 30C, or 30D and a single-sided mounting board on which the heat-generating components are mounted as the second electronic board 40A, 40B, 40C, or 40D. The present invention is also applicable to an electronic control device including a double-sided mounting board on which the heat-generating components are mounted as the first electronic board 30A, 30B, 30C, or 30D and a single-sided mounting board on which no heat-generating component is mounted as the second electronic board 40A, 40B, 40C, or 40D.

As for the material of the electronic boards, if a ceramic board is used in place of the inexpensive epoxy resin board, higher heat-conducting performance for the heat-generating components is obtained and the components can be mounted at higher density. Therefore, a small electronic control device can be obtained.

Each of the electronic control device 10A according to the first embodiment and the electronic control device 10C according to the third embodiment is the transmission control device for the automobile transmission and uses the hydraulic working oil as the cooling medium. However, it is apparent that the electronic control device and the cooling medium are not limited to those described above.

For example, the electronic control device may be a drive control device for a radiator fan of a water-cooled automobile engine control device, and the cooling medium may be cooling water which flows back to the radiator.

Alternatively, the electronic control device may be an intake-air amount detection control device for an automobile engine control device, and the cooling medium may be an intake atmospheric air for an automobile engine.

In the cases described above, the cooling-medium sensor 80*a* detects the temperature or the pressure of the cooling water or the intake atmospheric air, whereas the simplified cooling-medium sensor 80*b* detects the temperature of the cooling water or the intake atmospheric air.

The electronic control device 10B according to the second embodiment is the drive control device for the radiator fan of the water-cooled automobile engine control device. In the electronic control device 10B, the cooling medium is the cooling water flowing back to the radiator. However, it is apparent that the electronic control device and the cooling medium are not limited to those described above.

For example, the electronic control device may be the transmission control device for the automobile transmission, and the cooling medium may be the hydraulic working oil.

Alternatively, the electronic control device may be the intake-air amount detection control device for the automobile engine control device, and the cooling medium may be the intake atmospheric air introduced into the automobile engine.

In the cases described above, the cooling-medium sensor 80*a* detects the temperature or the pressure of the hydraulic working oil or the intake atmospheric air, whereas the simplified cooling-medium sensor 80*b* detects the temperature of the hydraulic working oil or the intake atmospheric air.

The electronic control device 10D according to the fourth embodiment is the intake-air amount detection control device for the automobile engine control device and uses the intake atmospheric air introduced into the automobile engine as the cooling medium. However, it is apparent that the electronic control device and the cooling medium in the fourth embodiment are not limited to those described above.

For example, the electronic control device 10D may be the transmission control device for the automobile transmission, and the cooling medium may be the hydraulic working oil.

Alternatively, the electronic control device 10D may be the drive control device for the radiator fan of the water-cooled automobile engine control device, and the cooling medium may be the cooling water flowing back to the radiator.

In the cases described above, the cooling-medium sensor 80*a* detects the temperature or the pressure of the hydraulic working oil or the cooling water, whereas the simplified cooling-medium sensor 80*b* detects the temperature of the hydraulic working oil or the cooling water.

The cooling sensor 80*c* detects a flow rate of the hydraulic working oil or the cooling water.

What is claimed is:

1. A resin-sealed electronic control device, comprising:
    a first electronic board and a second electronic board, to each of which a plurality of external connection terminals are connected, each of the first electronic board and the second electronic board carrying a plurality of circuit components mounted thereon;
    a thermally conductive support member comprising an upper surface and a lower surface, on which the first electronic board and the second electronic board are respectively bonded to be fixed; and
    a synthetic resin serving as an exterior covering material for integrally molding the entire first electronic board, the entire second electronic board, a portion of each of the plurality of external connection terminals, and a portion of the support member, wherein:
    the support member is formed of a pair of thermally conductive separate beam members for retaining the first electronic board and the second electronic board at a distance from each other;
    a pair of opposite side end portions of the first electronic board and a pair of opposite side end portions of the second electronic board opposed to each other, the pair of opposite side end portions of the first electronic board being bonded to be fixed onto one of upper surfaces and lower surfaces of the pair of separate beam members with an adhesive, the pair of opposite side end portions of the second electronic board being bonded to be fixed onto another of the upper surfaces and the lower surfaces of the pair of separate beam members with an adhesive;
    at least one of the first electronic board and the second electronic board is a double-sided board comprising an inner surface on which an inner circuit component is mounted and an outer surface on which outer circuit components are mounted, the outer circuit components comprising heat-generating components being mounted on an outer surface of at least one of the first electronic board and the second electronic board;
    the heat-generating components are adjacent to and opposed to the pair of separate beam members with the adhesives interposed therebetween;

the inner circuit component is arranged between the pair of separate beam members and has a smaller height size than a distance between the first electronic board and the second electronic board opposed to each other; and the exterior covering material fills a narrow space surrounded by the first electronic board, the second electronic board, and the pair of separate beam members.

2. A resin-sealed electronic control device according to claim 1, wherein the pair of separate beam members are connected to each other by one of welding, brazing, and bonding with a thermally conductive connection plate having a window hole for insertion of the inner circuit component.

3. A resin-sealed electronic control device according to claim 1, wherein each of the pair of separate beam members is formed of a hollow cylindrical member inside which a cooling medium resides and flows.

4. A resin-sealed electronic control device according to claim 3, wherein:

an end of one of the pair of separate beam members is brought into communication with an end of another of the pair of separate beam members by a connection portion; and the cooling medium flows from the one of the pair of separate beam members back to the one of the pair of separate beam members through the another of the pair of separate beam members.

5. A resin-sealed electronic control device according to claim 3, wherein:

at least one of the pair of separate beam members is provided with a small window, into which a cooling-medium sensor for detecting one of a temperature and a pressure of the cooling medium is inserted; and the cooling-medium sensor fixed into the small window is electrically connected to at least one of the first electronic board and the second electronic board.

6. A resin-sealed electronic control device according to claim 3, wherein:

a temperature sensor is provided in an area of at least one of the first electronic board and the second electronic board, the area being adjacent to and opposed to one of the pair of separate beam members with one of the adhesives interposed therebetween; and the temperature sensor indirectly detects a temperature of the cooling medium.

7. A resin-sealed electronic control device according to claim 3, wherein:

at least one of the pair of separate beam members is provided with a small window, through which a hot wire serving as a flow rate sensor for detecting a flow rate of the cooling medium passes; and the hot wire passing through the small window is provided so that the hot wire bridges the first electronic board and the second electronic board.

8. A resin-sealed electronic control device according to claim 5, wherein:

the cooling medium is one of hydraulic working oil used for an automobile transmission, cooling water flowing back to a radiator of a water-cooled automobile engine, and intake atmospheric air for an automobile engine; and the cooling-medium sensor is a temperature sensor for detecting a temperature of the one of the hydraulic working oil, the cooling water, and the intake atmospheric air.

9. A resin-sealed electronic control device according to claim 5, wherein:

the cooling medium is one of hydraulic working oil used for an automobile transmission, cooling water flowing back to a radiator of a water-cooled automobile engine, and intake atmospheric air for an automobile engine; and the cooling-medium sensor is a pressure sensor for detecting a pressure of one of the hydraulic working oil, the cooling water, and the intake atmospheric air.

10. A resin-sealed electronic control device according to claim 7, wherein:

the cooling medium is one of hydraulic working oil used for an automobile transmission, cooling water flowing back to a radiator of a water-cooled automobile engine, and intake atmospheric air for an automobile engine; and the cooling-medium sensor is a flow rate sensor for detecting a flow rate of the one of the hydraulic working oil, the cooling water, and the intake atmospheric air.

11. A resin-sealed electronic control device according to claim 1, wherein:

the plurality of external connection terminals are located outside the pair of separate beam members and are arranged in parallel to the pair of separate beam members; and the first electronic board and the second electronic board are electrically connected to each other at a position inside the pair of separate beam members.

12. A resin-sealed electronic control device according to claim 1, wherein:

the plurality of external connection terminals are located inside the pair of separate beam members and are arranged vertically to the pair of separate beam members;

the plurality of external connection terminals are grouped into at least a first group and a second group, and a resin injection port through which the synthetic resin is injected between dies is located at an intermediate position between the first group and the second group; and the first electronic board and the second electronic board are electrically connected to each other at a position any one of inside and outside the pair of separate beam members.

13. A method of fabricating the resin-sealed electronic control device according to claim 1 comprising:

connecting the first electronic board and the second electronic board to each other;

connecting the plurality of external connection terminals to the first electronic board and the second electronic board; and molding the exterior covering material by injecting the heated and melted synthetic resin under pressure between dies along a longitudinal direction of the pair of separate beam members after heating and curing the adhesives.

* * * * *